(12) United States Patent
Lin et al.

(10) Patent No.: US 12,431,359 B2
(45) Date of Patent: Sep. 30, 2025

(54) SEMICONDUCTOR PACKAGE ELECTRICAL CONTACTS AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Michael J. Seddon, Gilbert, AZ (US); Francis J. Carney, Mesa, AZ (US); Takashi Noma, Ota (JP); Eiji Kurose, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 384 days.

(21) Appl. No.: 17/662,786

(22) Filed: May 10, 2022

(65) Prior Publication Data
US 2022/0270884 A1    Aug. 25, 2022

Related U.S. Application Data

(60) Division of application No. 16/861,910, filed on Apr. 29, 2020, now Pat. No. 11,367,619, which is a (Continued)

(51) Int. Cl.
*H01L 23/00* (2006.01)
*H01L 21/302* (2006.01)
(Continued)

(52) U.S. Cl.
CPC ............ *H01L 21/302* (2013.01); *H01L 21/48* (2013.01); *H01L 21/561* (2013.01); (Continued)

(58) Field of Classification Search
CPC ..................................................... H01L 23/562
See application file for complete search history.

(56) References Cited

U.S. PATENT DOCUMENTS

| 6,319,796 B1 | 11/2001 | Laparra et al. |
| 7,682,874 B2 | 3/2010 | Xiaochun et al. |
| | (Continued) | |

FOREIGN PATENT DOCUMENTS

| CN | 101552248 A | 10/2009 |
| CN | 104201114 A | 12/2014 |

OTHER PUBLICATIONS

Extended European Search Report, European Patent Application No. 18184165.1, Jan. 17, 2019, 8 pages.
(Continued)

*Primary Examiner* — Christopher A Johnson
(74) *Attorney, Agent, or Firm* — IPTechLaw

(57) ABSTRACT

Implementations of a semiconductor package may include a semiconductor die including a first side and a second side, the first side of the semiconductor die including one or more electrical contacts; and an organic material covering at least the first side of the semiconductor die. Implementations may include where the one or more electrical contacts extend through one or more openings in the organic material; a metal-containing layer coupled to the one or more electrical contacts; and one or more slugs coupled to one of a first side of the semiconductor die, a second side of the semiconductor die, or both the first side of the semiconductor die and the second side of the semiconductor die.

5 Claims, 21 Drawing Sheets

Related U.S. Application Data continuation-in-part of application No. 16/702,958, filed on Dec. 4, 2019, now Pat. No. 11,328,930, and a continuation-in-part of application No. 15/921,898, filed on Mar. 15, 2018, now Pat. No. 10,748,850, said application No. 16/702,958 is a division of application No. 15/679,661, filed on Aug. 17, 2017, now Pat. No. 10,529,576.

(51) Int. Cl.
*H01L 21/48* (2006.01)
*H01L 21/56* (2006.01)
*H01L 21/78* (2006.01)
*H01L 23/12* (2006.01)
*H01L 23/31* (2006.01)

(52) U.S. Cl.
CPC ............ *H01L 21/565* (2013.01); *H01L 21/78* (2013.01); *H01L 23/12* (2013.01); *H01L 23/3185* (2013.01); *H01L 24/04* (2013.01); *H01L 24/26* (2013.01); *H01L 2224/94* (2013.01)

(56) References Cited

U.S. PATENT DOCUMENTS

| | | | |
|---|---|---|---|
| 7,745,261 B2 | 6/2010 | Xiaochun et al. | |
| 8,836,146 B2 | 9/2014 | Chou et al. | |
| 9,496,193 B1 | 11/2016 | Roesner et al. | |
| 2003/0155641 A1 | 8/2003 | Yeo | |
| 2006/0046436 A1 | 3/2006 | Chuchi | |
| 2007/0087544 A1 | 4/2007 | Chang et al. | |
| 2007/0246806 A1* | 10/2007 | Ong | H01L 23/5389 257/666 |
| 2008/0014677 A1 | 1/2008 | Xiaochun et al. | |
| 2008/0227240 A1 | 9/2008 | Sharma et al. | |
| 2009/0215227 A1 | 8/2009 | Tan et al. | |
| 2011/0175242 A1 | 7/2011 | Grivna et al. | |
| 2012/0104580 A1 | 5/2012 | Feng et al. | |
| 2012/0205790 A1* | 8/2012 | Haga | H01L 21/4842 257/676 |
| 2014/0217556 A1 | 8/2014 | Peg et al. | |
| 2016/0225733 A1 | 8/2016 | Wilcoxen | |
| 2016/0254415 A1 | 9/2016 | Kaempf et al. | |
| 2017/0032981 A1 | 2/2017 | Chinnusamy | |
| 2017/0033026 A1* | 2/2017 | Ho | H01L 23/49827 |
| 2017/0236765 A1 | 8/2017 | Tamagawa et al. | |
| 2017/0243846 A1 | 8/2017 | Chen et al. | |
| 2018/0166396 A1 | 6/2018 | Lee et al. | |
| 2019/0319126 A1 | 10/2019 | Matsushima et al. | |
| 2020/0203302 A1 | 6/2020 | Chew | |

OTHER PUBLICATIONS

Nsulating Film Ajinomoto Build-Up Film, Ajinomoto Fine-TechnoCo., Inc., available at https: www.aft-website.com/en/electron/abf. Last vivisted Jul. 14, 2017.

ICAP Sidewall Isolated 0201/01005 DSN, Slide from JCAP, available at least as early as Jun. 22, 2017.

Anonymous, Integration of a Heat Sink (or Slug) and Lead in a Semiconductor Component for Improved thermal, surge and Rdson Characteristics, IP.com No. IPCOM000004597D, Feb. 27, 2001, 4 pages.

\* cited by examiner

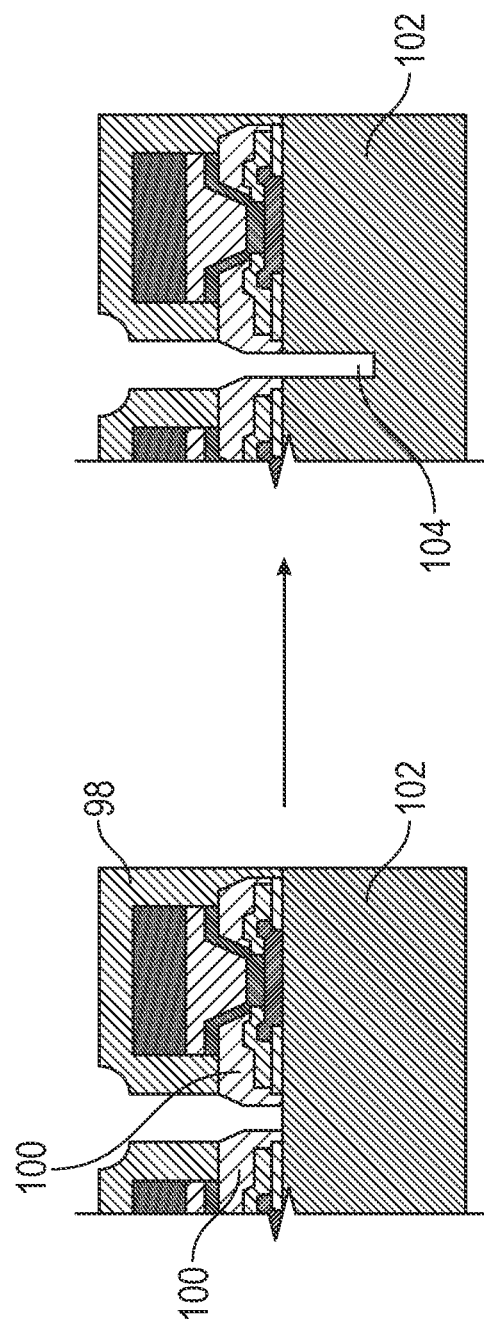
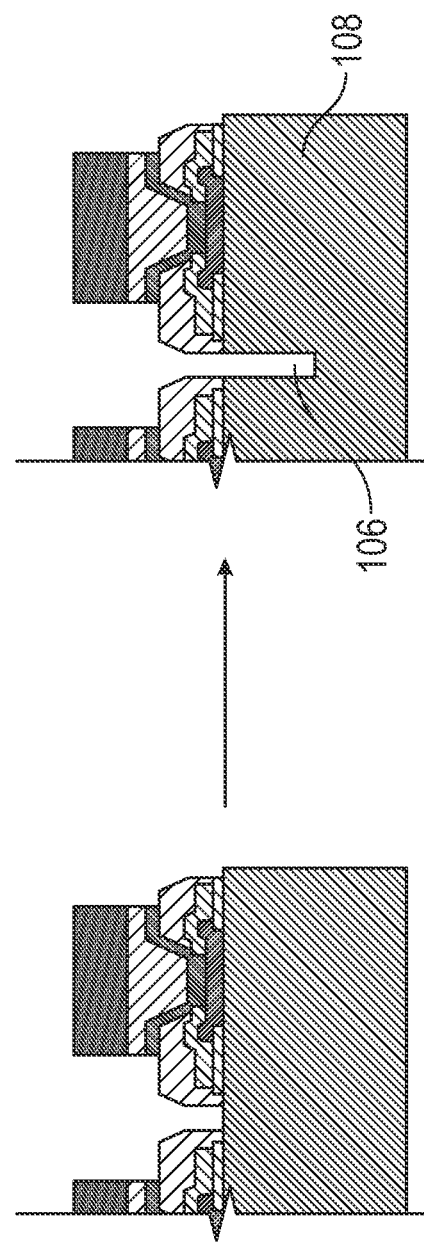
FIG. 11
FIG. 12

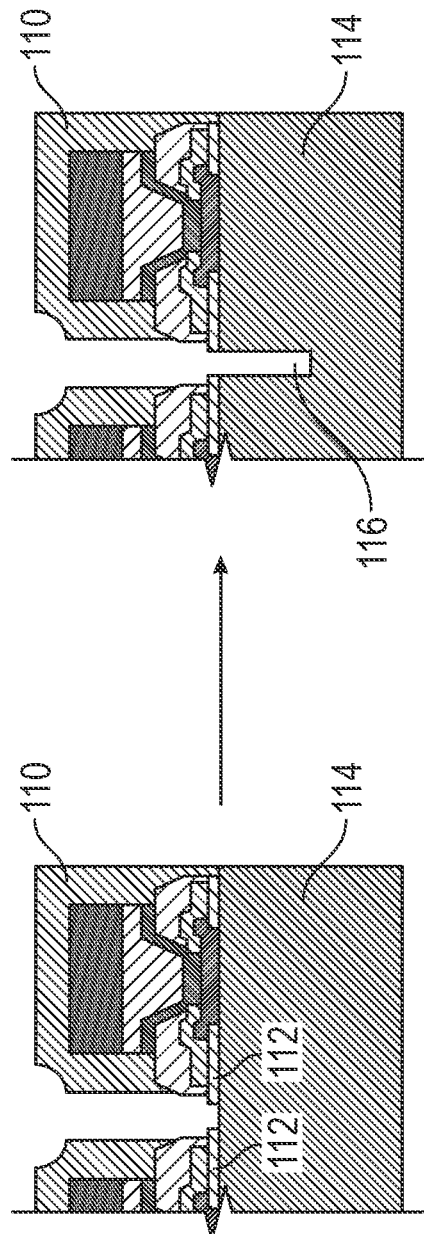
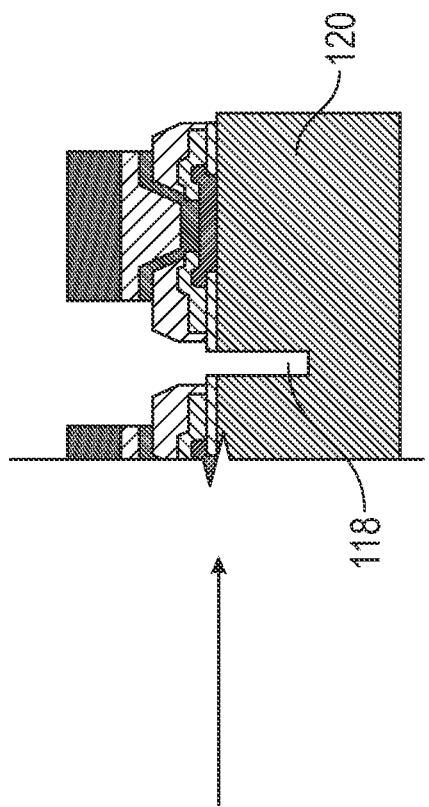
FIG. 13
FIG. 14

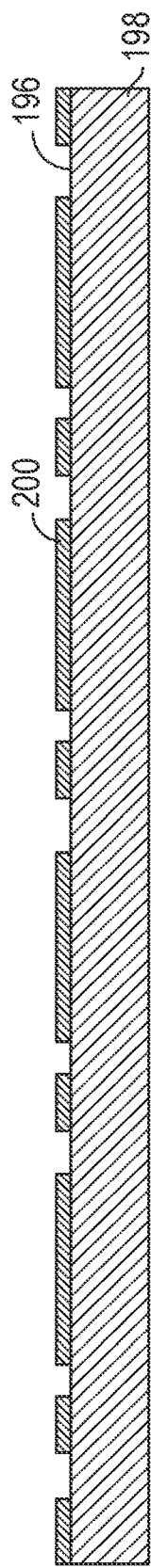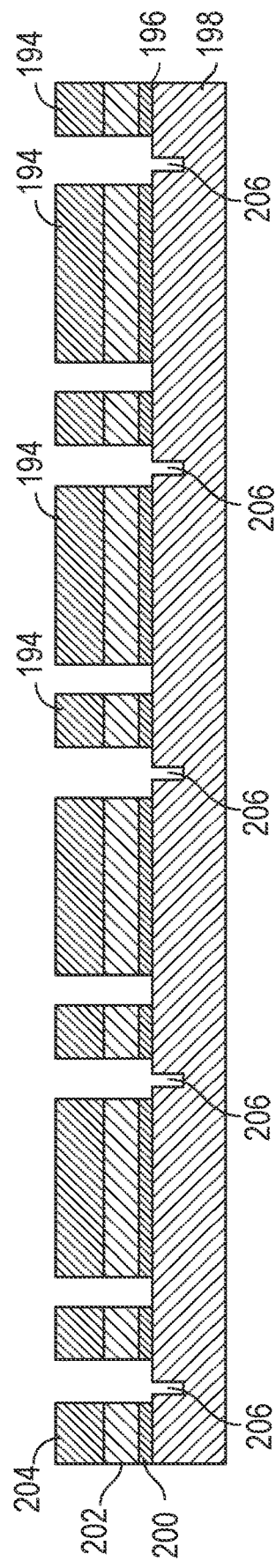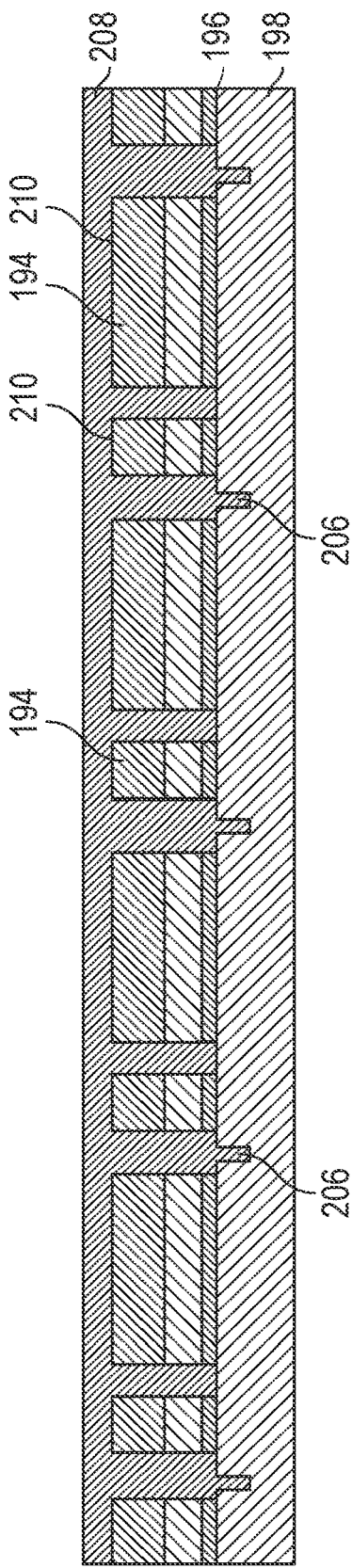

SEMICONDUCTOR PACKAGE ELECTRICAL CONTACTS AND RELATED METHODS

CROSS REFERENCE TO RELATED APPLICATIONS

This application is a divisional application of the earlier U.S. Utility Patent Application to Eiji Kurose entitled "Semiconductor Package Electrical Contacts and Related Methods," application Ser. No. 16/861,910, filed Apr. 29, 2020, now pending, which application is a continuation-in-part application of the earlier U.S. Utility Patent Application to Eiji Kurose entitled "Multi-Faced Molded Semiconductor Package and Related Methods," application Ser. No. 16/702,958, filed Dec. 4, 2019, now issued as U.S. Pat. No. 11,328,930; which was a divisional application of the earlier U.S. Utility Patent Application to Eiji Kurose entitled "Multi-Faced Molded Semiconductor Package and Related Methods," application Ser. No. 15/679,661, filed Aug. 17, 2017, issued on Jan. 7, 2020 as U.S. Pat. No. 10,529,576, the disclosures of each of which are hereby incorporated entirely herein by reference.

The Ser. No. 16/861,910 application is also a continuation-in-part application of the earlier U.S. Utility Patent Application to Lin et al., entitled "Thinned Semiconductor Package and Related Methods," application Ser. No. 15/921,898, filed Mar. 15, 2018, now issued as U.S. Pat. No. 10,748,850, the disclosure of which is hereby incorporated entirely herein by reference.

BACKGROUND

1. Technical Field

Aspects of this document relate generally to semiconductor packages, such as chip scale packages and flip chip packages. More specific implementations involve semiconductor packages covered by a mold compound.

2. Background

Decreasing semiconductor package size has long been desirable within the industry as it has generally resulted in economic benefits as well as technological benefits. A decrease in semiconductor package size often results in an increase in risk of damage to the semiconductor die and package during manufacturing. A protective cover or molding has generally covered portions of the semiconductor packages to protect the semiconductor from, among other things, the environment, electrostatic discharge, and electrical surges.

SUMMARY

Implementations of a semiconductor package may include a semiconductor die including a first side and a second side, the first side of the semiconductor die including one or more electrical contacts; and an organic material covering at least the first side of the semiconductor die. Implementations may include where the one or more electrical contacts extend through one or more openings in the organic material; a metal-containing layer coupled to the one or more electrical contacts; and one or more slugs coupled to one of a first side of the semiconductor die, a second side of the semiconductor die, or both the first side of the semiconductor die and the second side of the semiconductor die.

Implementations of semiconductor packages may include one, all, or any of the following:

The one or more slugs may be coupled directly to the metal-containing layer.

The one or more electrical contacts comprise a bump coupled to a die pad coupled to the first side of the semiconductor die.

The organic material may be a mold compound.

The metal-containing layer may be a solder resist layer.

The semiconductor die may include a thickness between 0.1 microns and 125 microns.

The one or more electrical contacts may be one of bumps or studs, the second side of the die further may include a backmetal, and the one or more slugs may be coupled to the backmetal.

Implementations of a method of forming a semiconductor package may include providing a semiconductor substrate including a plurality of semiconductor die, the semiconductor substrate including a first side and a second side; and forming one or more electrical contacts on the first side of the semiconductor die, the one or more electrical contacts coupled with the plurality of semiconductor die. Implementations may include applying an organic material to the first side of the semiconductor die. The one or more electrical contacts may extend into one or more openings in the organic compound. Implementations may include leveling the organic material with a surface of the one or more electrical contacts; and directly coupling one or more slugs to one or more of the one or more electrical contacts or to the second side of the semiconductor substrate.

Implementations of a method of forming a semiconductor package may include one, all, or any of the following:

The one or more slugs may be coupled directly to a metal-containing layer comprised in the one or more electrical contacts.

The metal-containing layer may be a solder resist material.

The one or more electrical contacts may be coupled to a pad comprised in the plurality of semiconductor die.

Implementations of the method may include grooving a surface of the semiconductor substrate at a plurality of die streets between the plurality of semiconductor die.

Implementations of the method may include forming a backmetal on the second side of the semiconductor substrate.

Implementations of the method may include directly coupling the one or more slugs to the backmetal.

Implementations of the method may include thinning the semiconductor substrate to a thickness of 0.1 microns to 125 microns.

The plurality of electrical contacts may be one of bumps or studs that extend above the organic material and the one or more slugs may be directly coupled with the second side of the semiconductor substrate.

Implementations of a method of forming a semiconductor package may include providing a semiconductor substrate including a plurality of semiconductor die, the semiconductor substrate including a first side and a second side; forming one or more electrical contacts on the first side of the semiconductor die by forming at least a portion of the one or more electrical contacts to a predetermined height, the one or more electrical contacts coupled with the plurality of semiconductor die. Implementations may include applying an organic material to the first side of the semiconductor die. The one or more electrical contacts may extend into one or more openings in the organic compound. Implementations of the method may include leveling the organic material with a surface of the one or more electrical contacts. The predetermined height of the formed portion of the one or more electrical contacts may reduce warpage of the semiconductor package to below 200 microns.

Implementations of a method of forming a semiconductor package may include one, all, or any of the following:

Forming the one or more electrical contacts may include electroplating.

Forming the plurality of electrical contacts may include evaporating, sputtering, soldering, screen printing, silver sintering and any combination thereof.

The organic material may be a mold compound.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 11 illustrates a first alternative for forming the notches in the third process flow.

FIG. 12 illustrates a second alternative for forming the notches in the third process flow;

FIG. 13 illustrates a third alternative for forming the notches in the third process flow;

FIG. 14 illustrates a fourth alternative for forming the notches in the third process flow;

FIGS. 18A-18G are cross-section side views illustrating a semiconductor device following various steps of a method for forming the semiconductor package of FIG. 16;

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
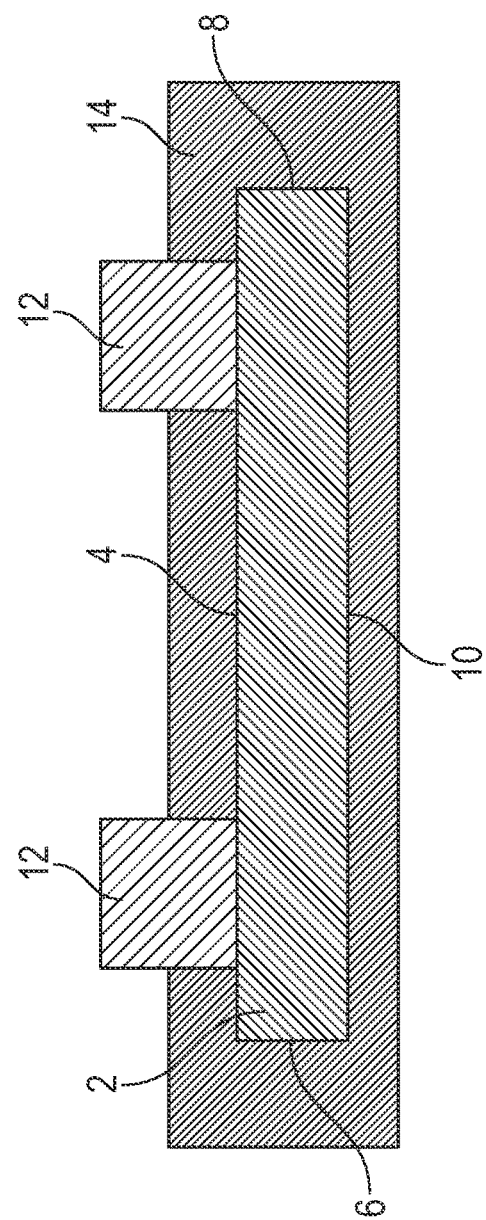
FIG. 1 is a cross sectional side view of a semiconductor package.

Referring to FIG. 1, a cross sectional side view of a semiconductor package is illustrated. The semiconductor package includes a die 2 which includes a first side 4, a second side 6, a third side 8 opposite the second side 6, a fourth side, a fifth side opposite the fourth side (both fourth and fifth sides are located into and out of the drawing surface in this view), and a sixth side 10 opposite the first side 4. In various implementations, the second side 6 of the die 2, the third side 8 of the die, the fourth side of the die, and/or the fifth side of the die may include a notch therein.

In various implementations, one or more electrical contacts 12 are coupled to the first side 4 of the die 2. In various implementations, the electrical contacts are metal and may be, by non-limiting example, copper, silver, gold, nickel, titanium, aluminum, any combination or alloy thereof, or another metal. In still other implementations, the electrical contacts 12 may not be metallic but may rather be another electrically conductive material.

In various implementations, a first mold compound 14 covers the first, second, third, fourth, and fifth sides of the die. In various implementations, the mold compound may be, by non-limiting example, an epoxy mold compound, an acrylic molding compound, or another type of material capable of physically supporting the die and providing protection against ingress of contaminants. In various implementations, a laminate resin or second mold compound covers the sixth side 10 of the die.

The electrical contacts 12 each extend through a corresponding plurality of openings in the first mold compound 14. In various implementations, the electrical contacts 12 extend beyond the surface of the molding 14, as illustrated in FIG. 1, while in other implementations the electrical contacts are level or flush with the surface of the molding compound 14.

In various implementations, the sides of the die will have no chips or cracks, particularly on the semiconductor device side of the die. This is accomplished through forming the second, third, fourth, and fifth sides of each die using etching techniques rather than a conventional sawing technique. Such a method is more fully disclosed is association with the discussion of FIG. 3 herein.

Further, the first mold compound may be anchored to the second, third, fourth, and fifth sides of the die. In various implementations, the anchor effect is the result of interaction of the mold compound with a plurality of ridges formed along the second, third, fourth, and fifth sides of the die. This anchoring effect is more fully disclose in association with the discussion of FIG. 3 herein.

Figure 2:
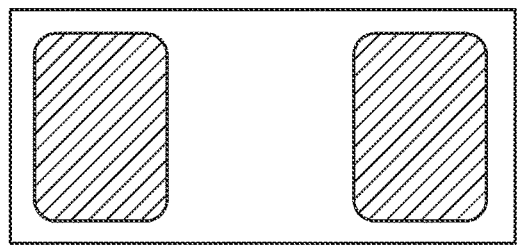
FIG. 2 is a top view of a semiconductor package.

Referring to FIG. 2, a top view of a semiconductor package is illustrated. The molding compound 14 is clearly seen in FIG. 2 encompassing a perimeter of each electrical contact 12 (the shaded areas in FIG. 2) so that the entire first side of the die (along with every other side) is not exposed.

Figure 3:
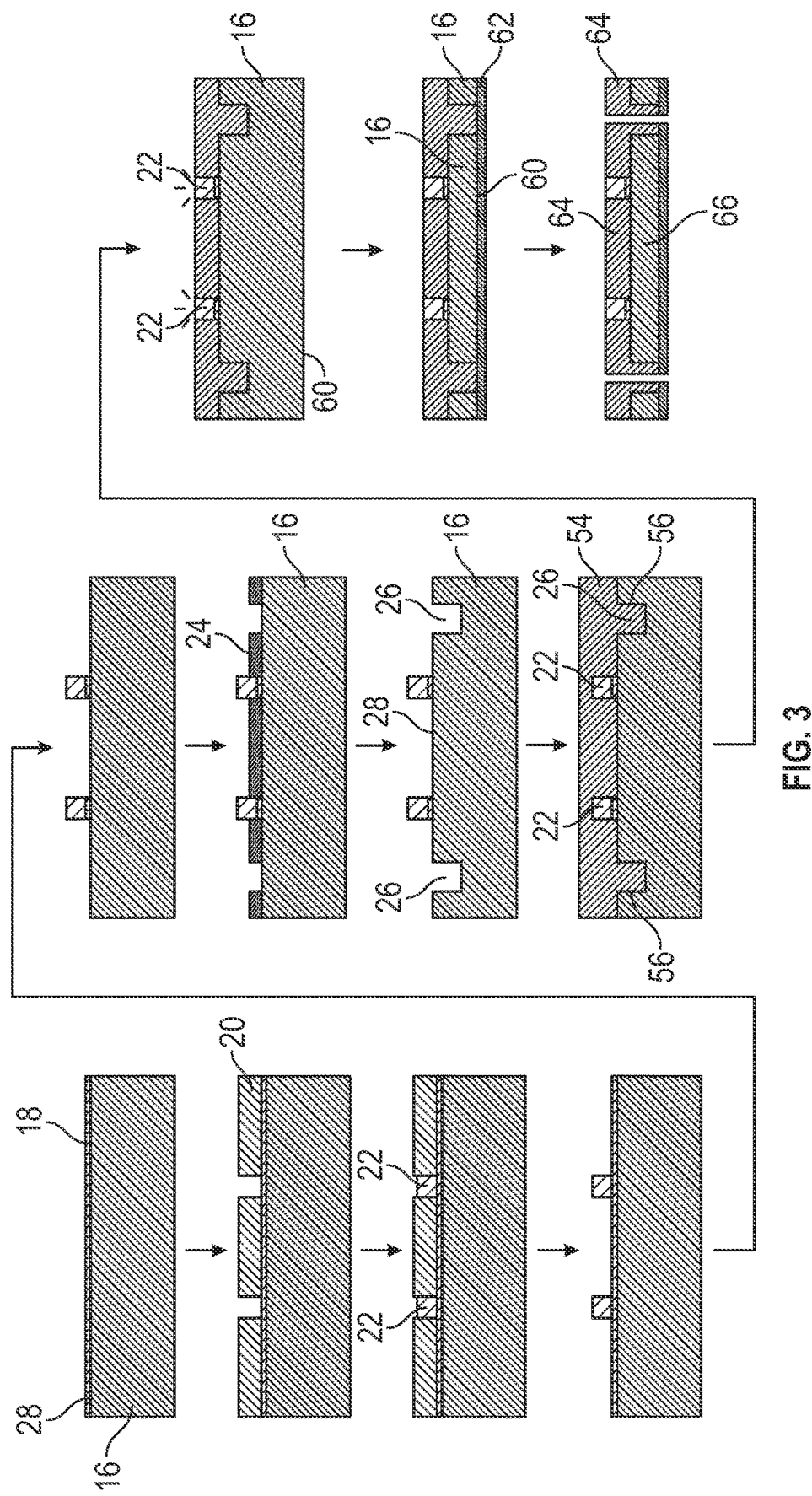
FIG. 3 is a first process flow illustrating the formation of a semiconductor package.

Referring to FIG. 3, a first process flow illustrating the formation of a semiconductor package is illustrated. In various implementations, the method for making a semiconductor package includes providing a wafer 16 which may include any particular type of substrate material, including, by non-limiting example, silicon, sapphire, ruby, gallium arsenide, glass, or any other semiconductor wafer substrate type. In various implementations, a metal layer 18 is formed on a first side 28 of the wafer 16 and may be formed using a sputtering technique. In other implementations, the metal layer 18 is formed using other techniques, such as, by non-limiting example, electroplating, electroless plating, chemical vapor deposition, and other methods of depositing a metal layer. In a particular implementation, the metal layer is a titanium/copper seed layer, while in other implementations, the metal layer may include, by non-limiting example, copper, titanium, gold, nickel, aluminum, silver, or any combination or alloy thereof.

In various implementations, a first photoresist layer 20 is formed and patterned over the metal layer 18. One or more electrical contacts 22 may be formed on the metal layer 18 and within the photoresist layer 20. In various implementations this may be done using various electroplating or electroless plating techniques, though deposition and etching techniques could be employed in various implementations. The electrical contacts 22 may be any type of electrical contact previously disclosed herein (bumps, studs, and so forth). In various implementations, the first photoresist layer 20 is removed through an ashing or solvent dissolution process and the metal layer 18 may be etched away after the electrical contacts are formed.

Figure 9:
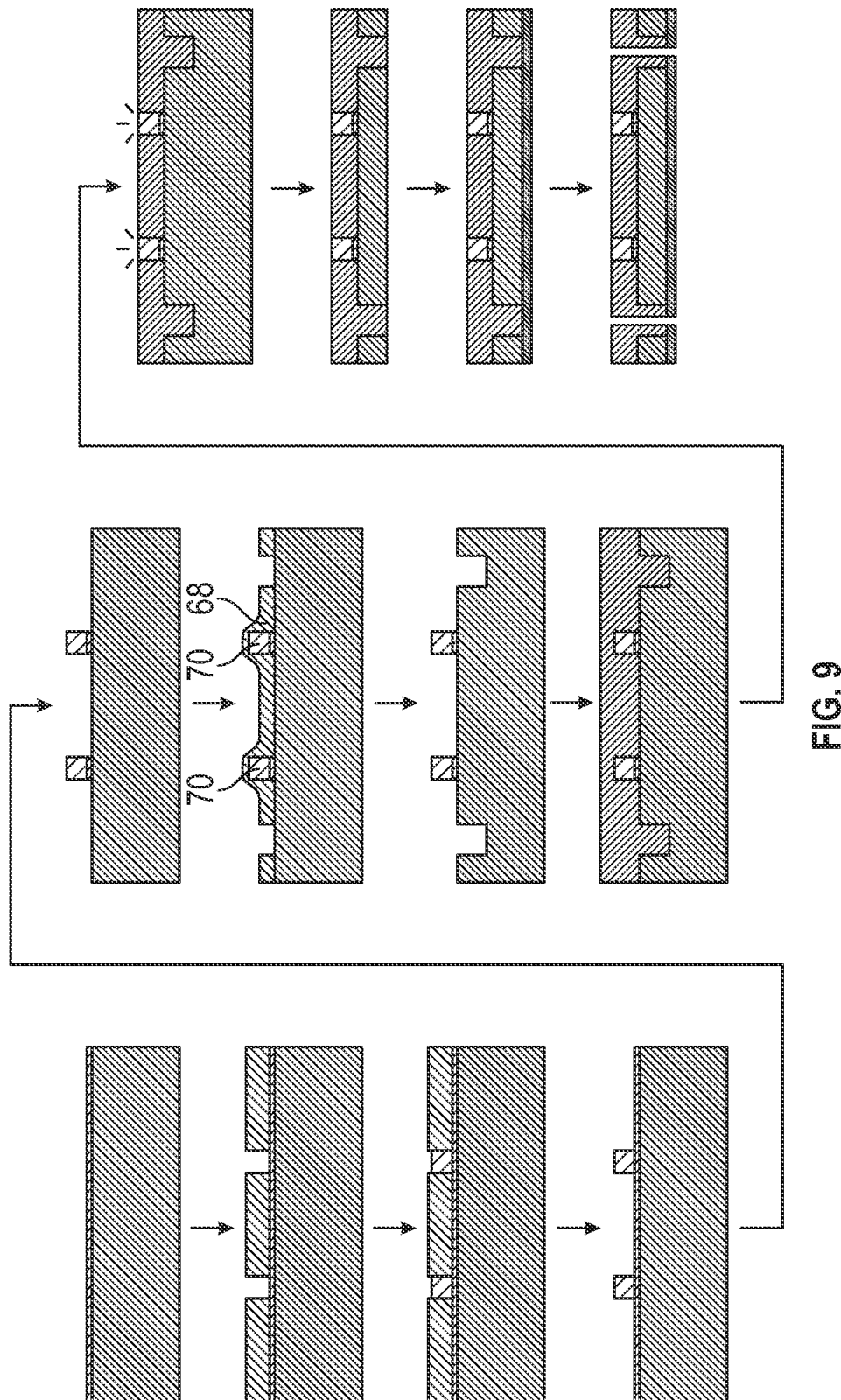
FIG. 9 is a second process flow illustrating the formation of a semiconductor package.

In various implementations, a second photoresist layer 24 is formed and patterned over the wafer 16. In various implementations, as illustrated in FIG. 3, the second patterned photoresist layer 24 does not cover the electrical contacts 22. In other implementations, the second photoresist layer is formed conformally over the electrical contacts along with the wafer. Referring to FIG. 9, a second process flow illustrating the formation of a semiconductor package is illustrated. In this process flow, a second photoresist layer 68 is formed as a conformal layer over the electrical contacts 70. Aside from this difference, the process depicted in FIG. 9 includes the same process steps as the process depicted in FIG. 3.

Referring back to FIG. 3, in various implementations, the method includes etching a plurality of notches 26 into the first side 28 of the wafer 16 using the second patterned photoresist layer. In various implementations, the width of the notches may be between about 50 and about 150 microns wide while in other implementations, the width of the notches may be less than about 50 microns or more than about 150 microns. In various implementations, the depth of the plurality of notches 26 may extend between about 25 and 200 microns into the wafer while in other implementations, the depth of the plurality of notches 26 may be less than about 25 microns or more than about 200 microns.

In various implementations, the plurality of notches may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the plurality of notches 26 in the first side 28 of the wafer 16.

Figure 4:
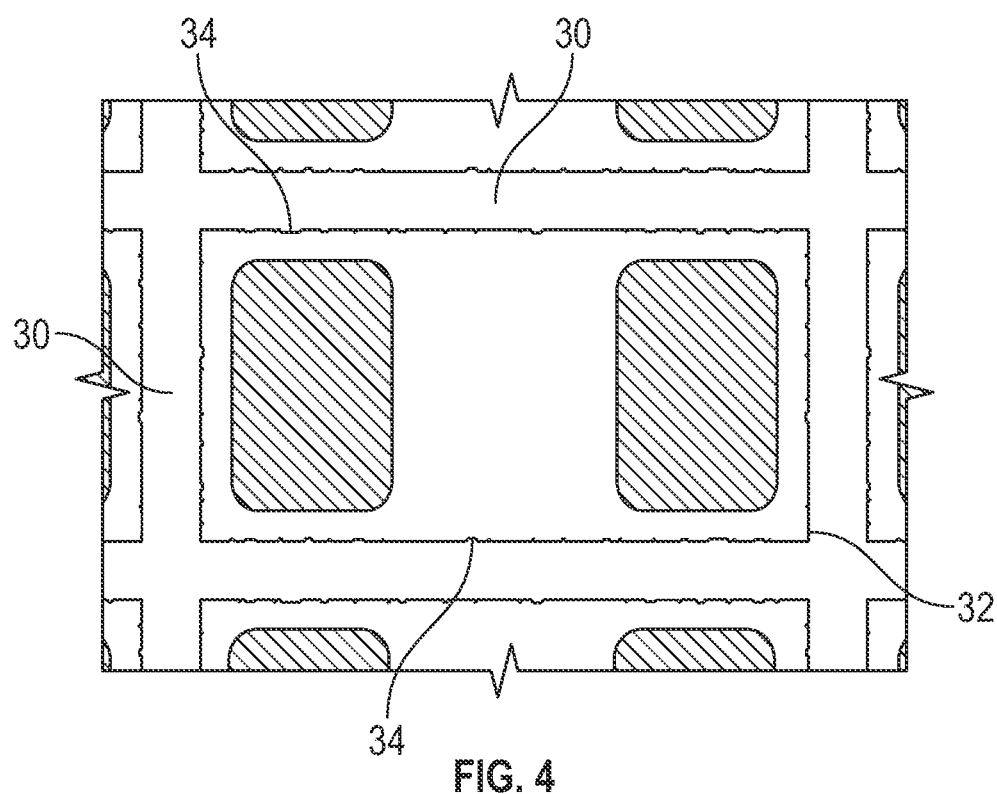
FIG. 4 is a top view of a semiconductor wafer with a plurality of notches cut therein.

Referring now to FIG. 4, a top view of a conventional semiconductor wafer with a plurality of saw cuts surrounding the plurality of die is illustrated. Using a saw to cut notches in a semiconductor wafer invariably results in the production of chips and cracks on the device side of the die and in the sidewalls 34 of the notches 30. The presence of the cracks and chips has the potential to compromise the reliability of the semiconductor package if the cracks and chips propagate into the device portion of the semiconductor die. Since the saw process involves the rubbing of the rotating blade against the die surface, the chipping and cracking can only be managed through saw processing variables (wafer feed speed, blade kerf width, cut depth, multiple saw cuts, blade materials, etc.) but not eliminated. Furthermore, because the saw process relies on passing the wafer underneath the blades, only square and rectangular sized die are typically produced using conventional saw techniques.

Figure 5:
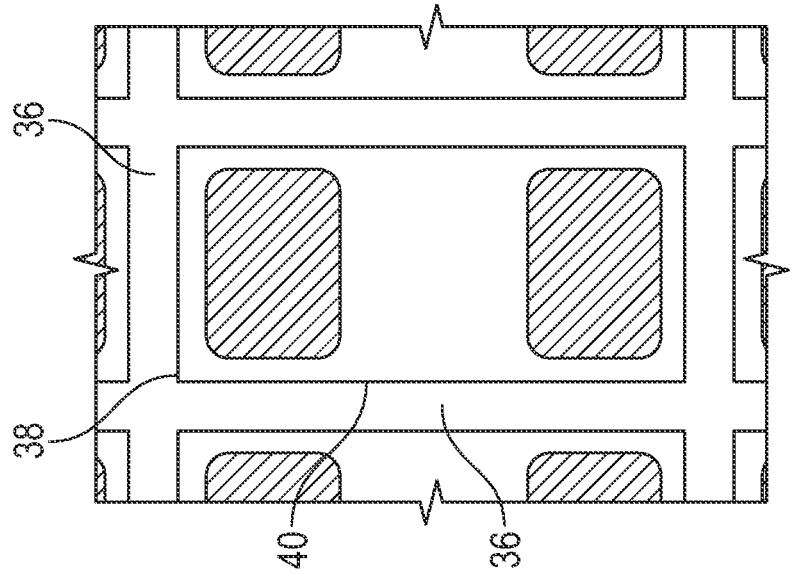
FIG. 5 is a top view of a semiconductor wafer with a plurality of notches etched therein.

Referring to FIG. 5, a top view of a semiconductor wafer with a plurality of notches etched therein is illustrated. In contrast to the appearance of the die processed using the conventional sawing method illustrated in FIG. 4, the plurality of notches 36 in the wafer 38 formed using etching techniques have edges and sidewalls 40 that do not exhibit cracks or chips therein. Because of the absence of the cracks and chips, the use of etching techniques to form a plurality of notches in a semiconductor wafer is likely to improve the reliability of the resulting semiconductor packages.

Figure 7:
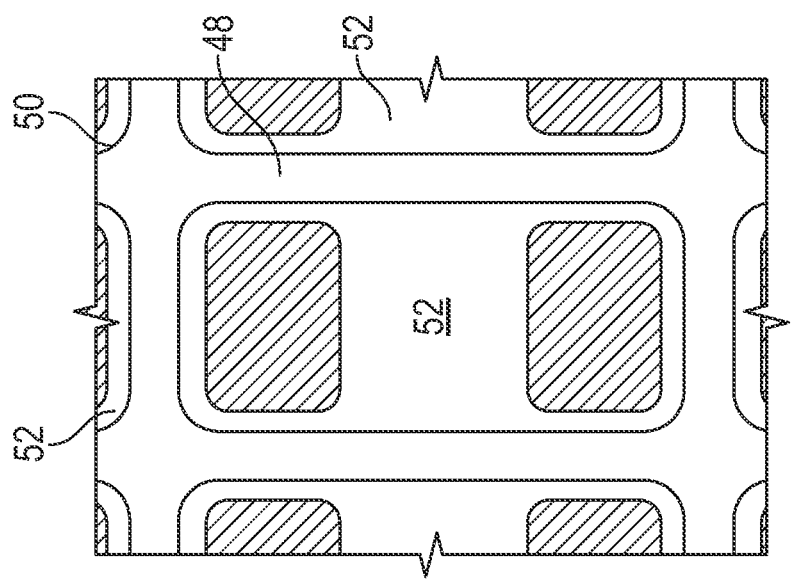
FIG. 7 is a top view of a third implementations of a semiconductor wafer with a plurality of notches etched therein.
Figure 6:
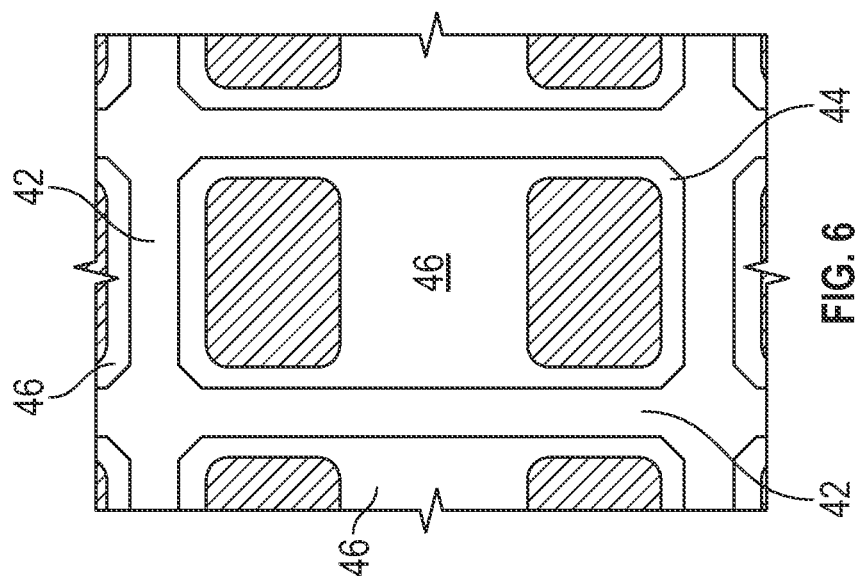
FIG. 6 is a top view of a second implementation of a semiconductor wafer with a plurality of notches etched therein.

Furthermore, using etching techniques to form a plurality of notches in a wafer allows for different shapes of perimeters of die to be produced. In various implementations, the second photoresist layer described in relation to FIG. 3 may be patterned in a way to form a plurality of notches that do not form die with rectangular perimeters. For example, referring to FIG. 6, a top view of a second implementation of a semiconductor wafer with a plurality of notches etched therein is illustrated. In various implementations, a plurality of notches 42 may be formed in a wafer 44. The plurality of notches 42 may form eventual die 46 with perimeters that are octagons. Referring to FIG. 7, a top view of a third implementations of a semiconductor wafer with a plurality of notches etched therein is illustrated. In various implementations, a plurality of notches 48 may be formed in a wafer 50. The plurality of notches 48 may form eventual die 52 with perimeters that are rounded rectangles. In other implementations, a plurality of notches may be formed in a wafer that form eventual die with perimeters that are any other closed geometrical shape.

Referring back to FIG. 3, in various implementations, the plurality of notches 26 formed have two substantially parallel sidewalls that extend substantially straight into the first side 28 of the wafer 16. In other implementations, two or more stepwise notches are formed in the first side 28 of the wafer 16. Each stepwise notch may be formed by creating a first notch in the wafer, and then forming a second more narrow notch within each first notch.

Referring to FIG. 3, an implementation of a method for forming a semiconductor package includes applying a first mold compound 54 into the plurality of notches 26 and over the first side of the wafer. In various implementations, as illustrated by FIG. 3, the first mold compound 54 may cover the electrical contacts 22. In other implementations, the first mold compound 54 may not completely cover the electrical contacts 22. The first mold compound may be applied using, by non-limiting example, a liquid dispensing technique, a transfer molding technique, a printer molding technique, or a compression molding technique. The molding compound may be an epoxy molding compound, an acrylic molding compound, or another type of molding compound disclosed herein.

Figure 8:
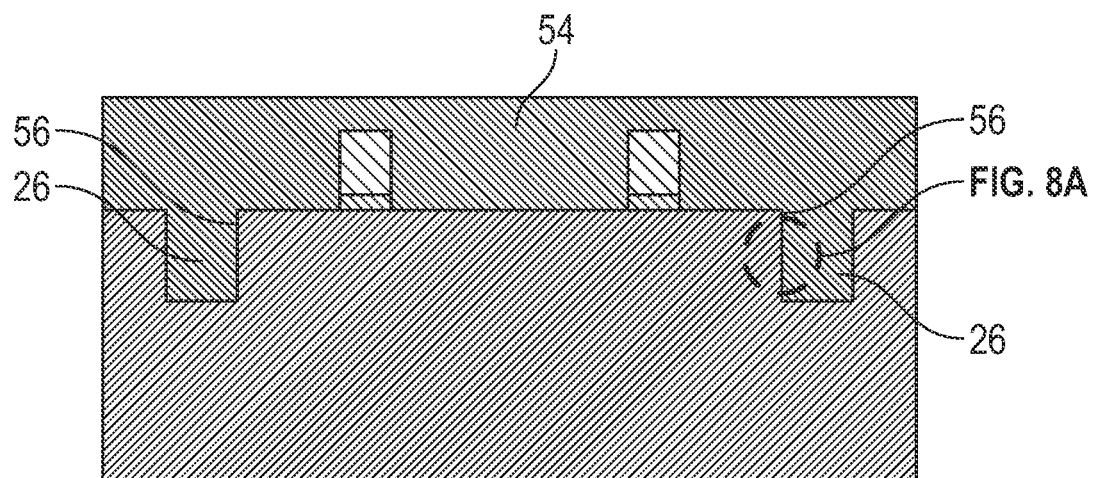
FIG. 8 is a cross sectional view of a portion of a wafer with molding applied thereto.
Figure 8A:
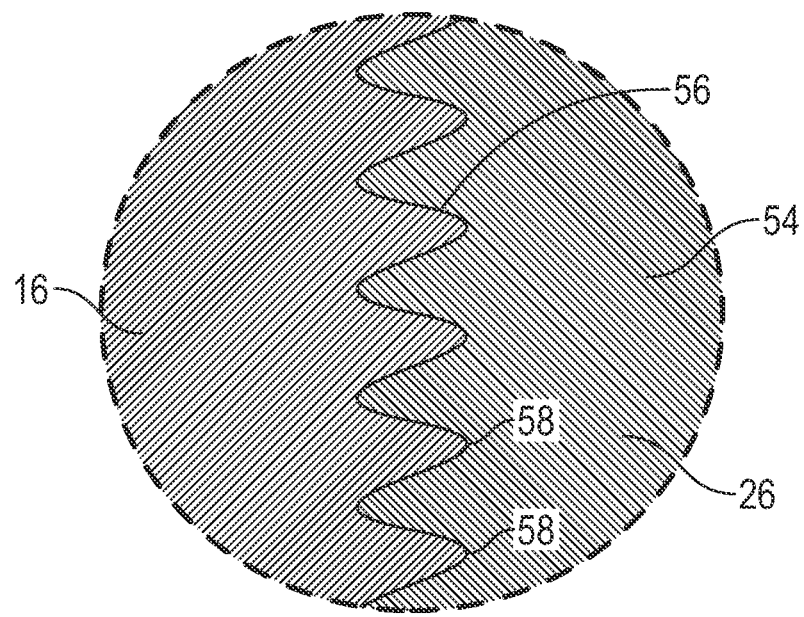
FIG. 8A is a magnified cross sectional view of the bond between a mold and a sidewall of a notch formed in the die.

In various implementations, the first mold compound 54 may be anchored to a plurality of sidewalls 56 of a plurality of notches 26. Referring now to FIG. 8, a cross sectional view of a portion of a wafer with molding applied thereto is illustrated. Referring now to FIG. 8A, a magnified cross sectional view of the bond between a mold and a sidewall of a notch formed in the die is illustrated. In various implementations, a plurality of ridges 58 may be formed in a sidewall 56 of each notch within the plurality of notches. In a particular implementation, the height of each ridge extending from the sidewall is substantially 0.2 microns tall with a pitch of substantially one micron. Thus, in implementations where the notch is 150 microns deep, there may be substantially 150 microns on each sidewall of the notch. In other implementations, the notches may be taller or shorter than 0.2 microns and may have a pitch more or less than one micron. The ridges may anchor the first mold compound 54 to the sidewalls 56 of the plurality of notches. In various implementations where the plurality of notches are etched using the Bosch process, the etching process may form ridges in the plurality of notches while etching the plurality of notches via the deposition/etching cycles of the deep reactive ion etch, thus increasing the adhesion between the first mold compound and the sidewall of each notch.

Referring back to FIG. 3, in various implementations where the first mold compound 54 covers the electrical contacts 22, the electrical contacts 22 may be exposed by grinding the first mold compound. In various implementations, a second side 60 of the wafer 16 may be ground to the plurality of notches 26 formed in the first side 28 of the wafer 16. In this way the various die of the semiconductor wafer are singulated from each other. In various implementations, the second side 60 of the wafer 16 may be ground using, by non-limiting example, a mechanical polishing technique, a chemical etching technique, a combination of a mechanical polishing and chemical etching technique, or any other grinding technique.

In various implementations, a second mold compound 62 or a laminate resin may be applied to the second side 60 of the wafer 16. In implementations where a second mold compound is applied, the mold compound may be any type of mold compound disclosed herein and may be applied using any technique disclosed herein.

In various implementations, as illustrated in the process flow depicted in FIG. 3, the first mold compound 54 is ground to expose the electrical contacts 22 before the second side 60 of the wafer 16 is ground and the second mold compound is applied. In other implementations, the first mold compound 54 may be ground to expose the electrical contacts 22 after the second side 60 of the wafer 16 is ground and the second mold compound is applied.

The method for making a semiconductor package includes singulating the wafer 16 into a plurality of semiconductor packages 64. The wafer 16 may be singulated by cutting or etching through the wafer where the plurality of notches 26 were originally formed. The wafer may be singulated by using, by non-limiting example, a saw, a laser, a waterjet, plasma etching, deep reactive-ion etching, or chemical etching. In various implementations, the Bosch process may be used to singulate the wafer 16. The method used to singulate the wafer may include singulating the wafer using thinner cuts or etches than were used to form the plurality of notches 26. In this manner, the first mold compound will cover the sides of each singulated die 66 within each semiconductor package 64. Specifically, in particular implementations the saw width used to singulate each semiconductor package may be between 20 and 40 microns thick. The semiconductor die within the semiconductor package may be covered by either a mold compound or a laminate resin on all six sides of the semiconductor die.

In various implementations, the first side of the die within each semiconductor package may include a perimeter that is, by non-limiting example, a rectangle, an octagon, a rectangle with rounded edges, or any other closed geometric shape.

Figure 10:
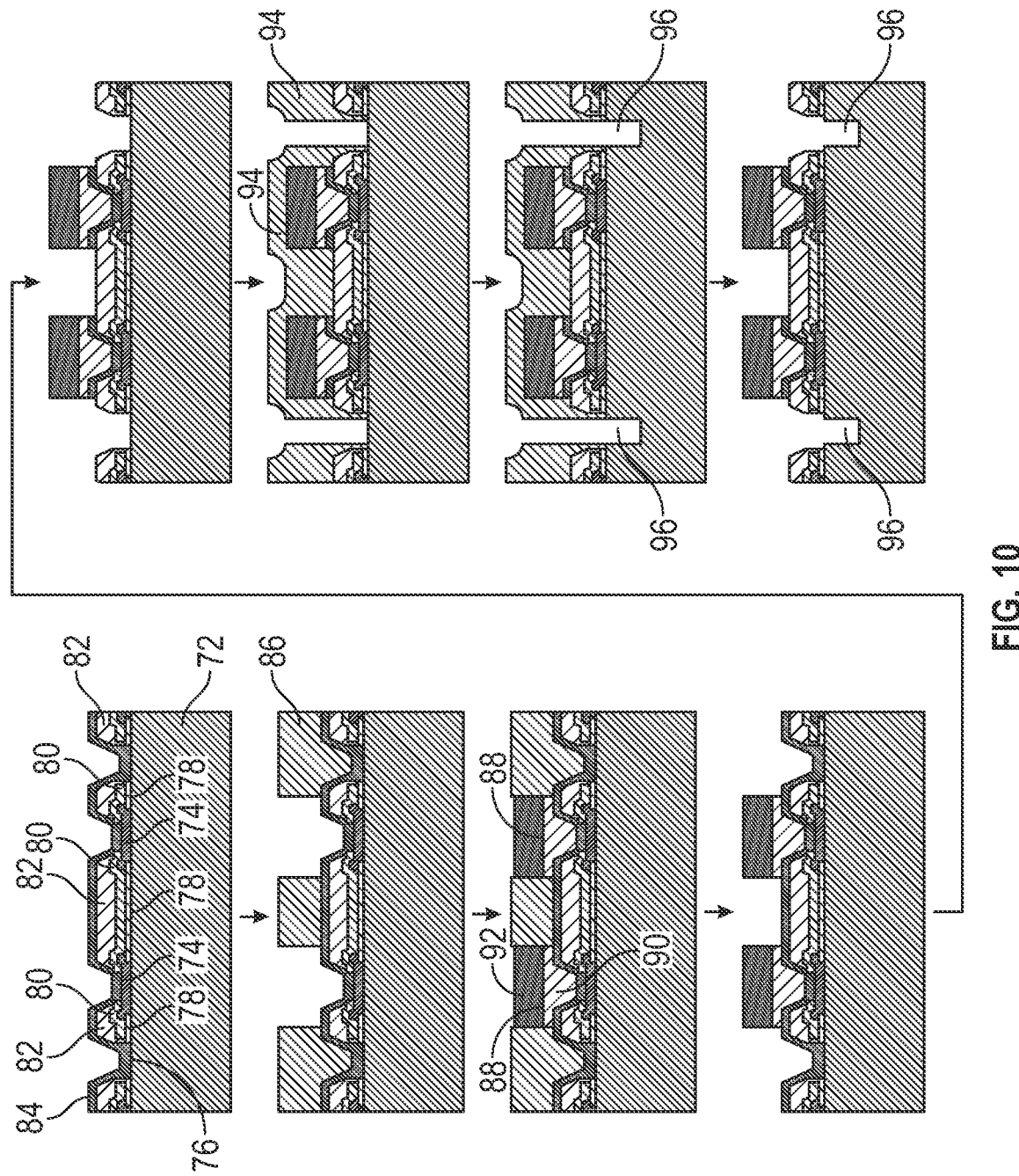
FIG. 10 is a third process flow illustrating a portion of the formation of a semiconductor package.

Referring now to FIG. 10, a third process flow illustrating a portion of the formation of a semiconductor package is illustrated. In various implementations the method for forming a semiconductor package includes providing a wafer 72, which may be any type of wafer substrate disclosed herein. In various implementations, one or more metal pads 74 may be coupled to a first side 76 of the wafer 72. The metal pad may include, by non-limiting example, aluminum, copper, nickel silver, gold, titanium, or any combination or alloy thereof.

In various implementations, a first passivation layer 78 may be coupled to a portion of the first side 76 of the wafer 72. The first passivation layer 78 may be a silicon dioxide passivation layer in various implementations, though it could be any of a wide variety of other types of layers, including, by non-limiting example, silicon nitride, polyimide, or another polymer or deposited material. In various implementations, a second passivation layer 80 may be coupled to a portion of the first side 76 of the wafer 72. The second passivation layer 80 may be a silicon nitride passivation layer. The second passivation layer may include the same material or a different material from the first passivation layer.

In various implementations, a third layer 82 may be coupled to a portion of the first side 76 of the wafer 72. The third layer may be either a polyimide, a polybenzoxazole, a phenol resin, or a combination of a polyimide, a polybenzoxazole, and a phenol resin. In various implementations, a metal seed layer 84 may be formed over the third layer and over the first side 76 of the wafer 72. The metal seed layer 84 may be any type of metal layer disclosed herein. In various implementations, the metal seed layer 84 may directly contact portions of the first side 76 of the wafer 72. In various implementations, the method includes forming and patterning a first photoresist layer 86 over the metal seed layer 84.

In various implementations, the method includes forming electrical contacts 88 coupled to the metal seed layer 84 and within the first photoresist layer 86. The electrical contacts 88 may be any type of electrical contact disclosed herein. In various implementations, the electrical contacts 88 may include a first layer 90 and a second layer 92. In various implementations, the first layer 90 may include copper and the second layer 92 may include tin, silver, or a combination of tin and silver. In various implementations, the method of forming a semiconductor package includes removing the first photoresist layer 86 and etching the portions of the metal seed layer 84 away that are not covered by the electrical contacts, after the electrical contacts are formed.

In various implementations, the method of forming a semiconductor package includes forming and patterning a second photoresist layer 94 over the first side 76 of the wafer 72. In various implementations, the second photoresist layer covers the electrical contacts 88, while in other implementations, the second photoresist layer 94 does not cover the electrical contacts 88. The second photoresist layer 94 may be used to etch a plurality of notches 96 into the wafer 72. The method includes removing the second photoresist layer 94 after the plurality of notches are etched into the wafer.

A first mold compound may be applied into the plurality of notches and over the first side 76 of the wafer 72 in the same manner the first mold compound in FIG. 3 is applied. The remainder of the method for forming a semiconductor package as depicted in FIG. 10 may include exposing the electrical contacts through grinding, grinding the backside of the wafer to the plurality of notches, applying a second mold compound or laminate resin to a backside of the wafer, and singulating the wafer into a plurality of semiconductor packages. These portions of forming a semiconductor package may be the same as or similar to respective portions for forming a semiconductor package illustrated by FIG. 3 and previously disclosed herein.

In various implementations, the semiconductor package produced by the method depicted in FIG. 10 may include one or more metal pads, one or more passivation layers, a polyimide, a phenol resin, a polybenzoxazole, and any combination thereof, between the semiconductor die and the first mold compound.

Referring to FIGS. 11-14, alternative methods for forming a plurality of notches in the process illustrated by FIG. 10 is illustrated. Referring to FIG. 11, a method of forming a plurality of notches using a patterned photoresist layer and one of a polyimide, polybenzoxazole, and a phenol resin in combination with an etching process is illustrated. In various implementations, a patterned photoresist layer 98 may be over a mask 100 including either a patterned polyimide layer, a patterned polybenzoxazole layer, or a patterned phenol resin layer. The mask 100 may be over a wafer 102. A notch 104 may be formed in the wafer 102 using the patterned photoresist layer and the mask using any etching process disclosed herein.

Referring to FIG. 12, a method of forming a plurality of notches using one of a polyimide, polybenzoxazole, and a phenol resin in combination with any etching process disclosed herein is illustrated. The method may be the same as the method depicted by FIG. 11, with the difference being that the method depicted by FIG. 12 does not include a patterned photoresist layer used to form a notch 106 into a wafer 108.

Referring to FIG. 13, a method of forming a plurality of notches using a patterned photoresist layer and passivation mask is illustrated. In various implementations, a patterned photoresist layer 110 may be over a passivation mask 112. The passivation mask 112 may include any passivation layer disclosed herein. The passivation mask 112 may be over a wafer 114. A notch 116 may be formed in the wafer 114 using the patterned photoresist layer 110 and the passivation mask 112 and any etching process disclosed herein.

Referring to FIG. 14, a method of forming a plurality of notches using a passivation mask in combination with any of the etching method disclosed herein is illustrated. The method may be the same as the method depicted by FIG. 13, with the difference being that the method depicted by FIG. 14 does not include a patterned photoresist layer used to form a notch 116 into a wafer 118.

Figure 15:
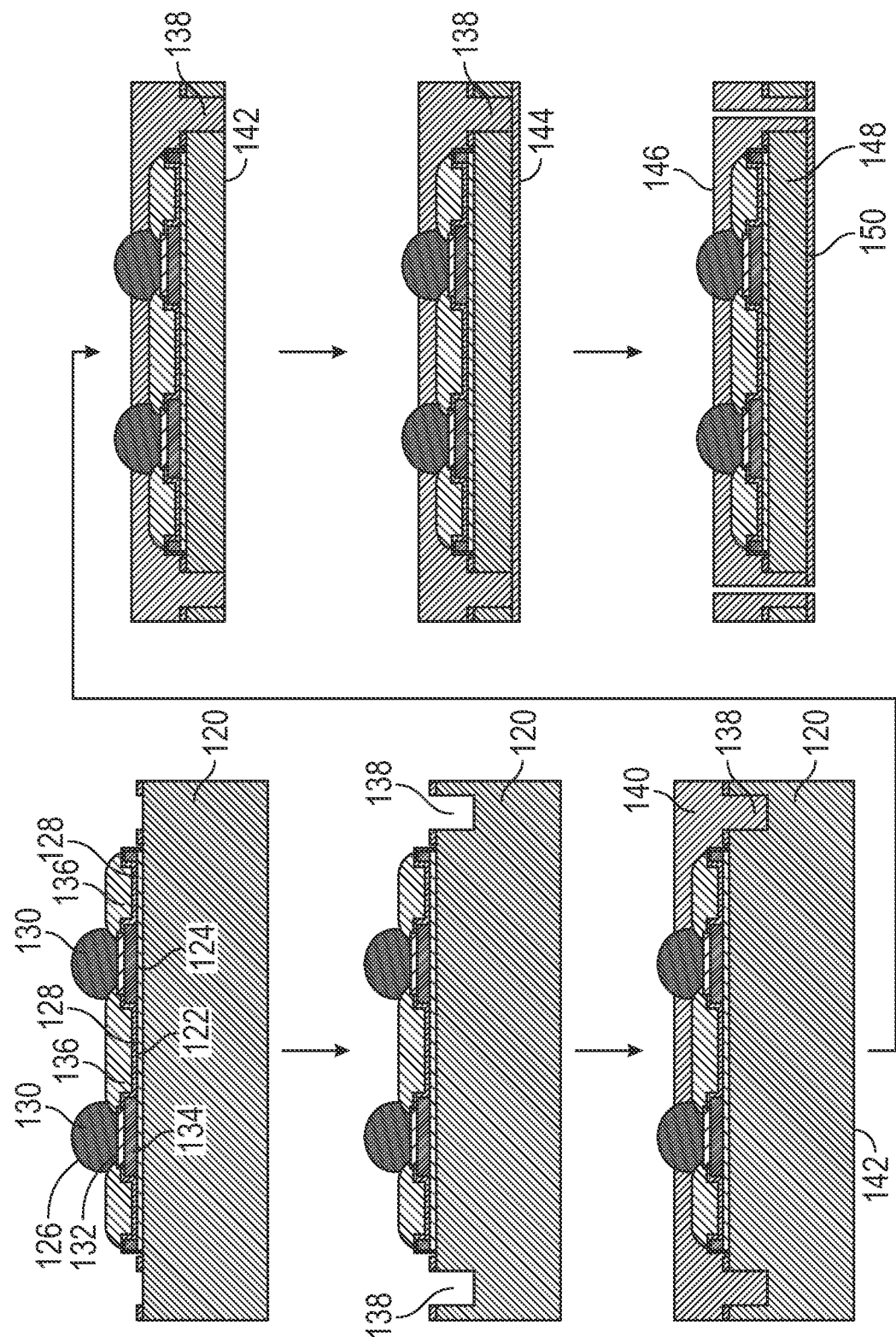
FIG. 15 is a fourth process flow illustrating the formation of a semiconductor package.

Referring to FIG. 15, a fourth process flow illustrating the formation of a semiconductor package is illustrated. The method for forming a semiconductor package illustrated in FIG. 15 includes providing a wafer 120. In various implementations, an interlayer 122 may be coupled to a first side 124 of the wafer 120. In various implementations, a passivation layer 128 may be coupled to the wafer 120. The passivation layer may be any type of passivation layer disclosed herein.

In various implementations, one or more electrical contacts 126 may be coupled to the wafer 120. In various implementations, the electrical contacts include a bump 130. The electrical contacts may include a first metal layer 132 coupled to the bump 130. The first metal layer may include any metal disclosed herein. In a particular implementation, the first metal layer includes nickel and gold. The electrical contacts 128 may include a second metal layer 134 coupled to the first metal layer 132. The second metal layer 134 may include any metal disclosed herein. In a particular implementation, the second metal layer 134 includes aluminum. In various implementations, a solder resist layer 136 may be coupled over the wafer 120. In other implementations, no solder resist layer is included.

In various implementations, the passivation layer 128 may be patterned and may directly contact portions of the wafer 120. In such implementations, the patterned passivation layer, or mask, may be used to etch a plurality of notches 138 into the first side 124 of the wafer 120 using any etching process disclosed herein. The plurality of notches may be etched using any method disclosed herein, and may be any type of notch previously disclosed herein.

In various implementations, a first mold compound 140 is applied into the plurality of notches 138 and over the first wafer 120. The first mold compound 140 may be any mold compound disclosed herein and may be applied using any technique disclosed herein. In various implementations, the first mold compound 140 does not entirely cover the electrical contacts 126, as is illustrated by FIG. 15. In other implementations, the first mold compound does entirely cover the electrical contacts 126. In implementations where the first mold compound 140 does entirely cover the electrical contacts 126, the first mold compound may be ground to expose the electrical contacts 126.

In various implementations, a second side 142 opposite the first side 124 of the wafer 120 may be ground using any grinding method disclosed herein to the plurality of notches. A second mold compound 144 or laminate resin may then be applied to the second side 142 of the wafer 120.

The wafer 120 may then be singulated into a plurality of semiconductor packages 146. The wafer may be singulated using any technique disclosed herein. The semiconductor die 148 with the semiconductor package 146 may have all six sides covered by a mold compound. In other implementations, the sixth side of the die 150 may be covered by a laminate resin.

In various implementations, the semiconductor package formed by the method illustrated in FIG. 15 may include either a solder resist layer, a passivation layer, an interlayer, or a combination of a solder resist layer, a passivation layer, and an interlayer coupled to the first side of the wafer and covered by the first mold compound.

Figure 16:
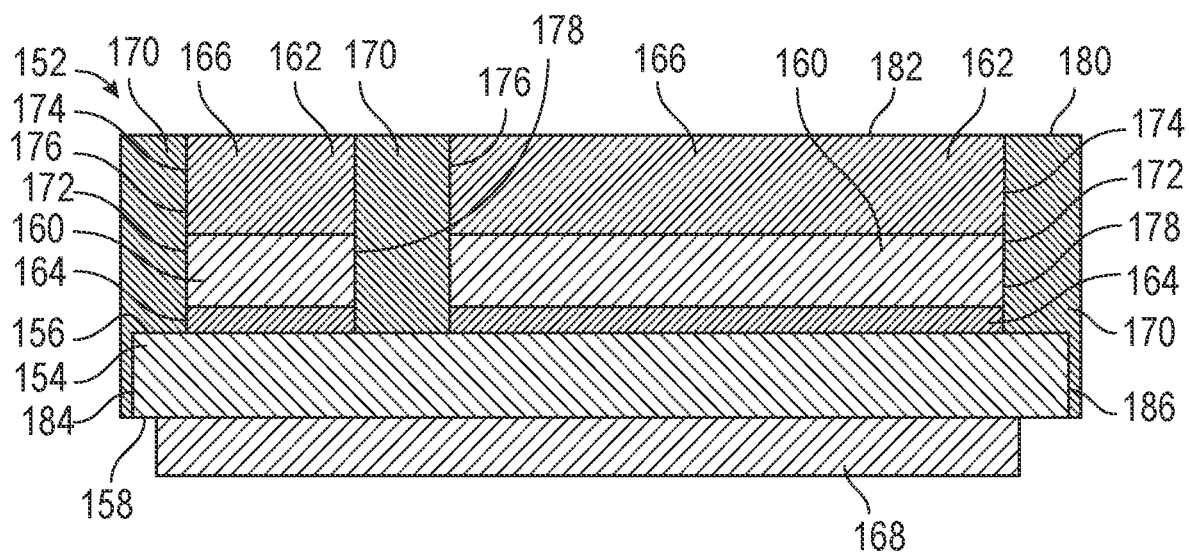
FIG. 16 is a cross-section side view of an implementation of a semiconductor package.

Referring to FIG. 16, a cross-section side view of an implementation of a semiconductor package is illustrated. In various implementations, the semiconductor packages disclosed herein may include power semiconductor devices, however, in other implementations other semiconductor device types (transistors, microprocessors, passive components, etc.) may be included in the semiconductor packages. In various implementations, the semiconductor package 152 includes a die 154. The die 154 may be a silicon die, and in such implementations, the silicon die could be any type of silicon die including, by non-limiting example, an epitaxial silicon die, silicon-on-insulator, polysilicon, any combination thereof, or any other silicon-containing die material. Further, it is also understood that in various implementations a die other than a silicon-containing die may be used, such as, by non-limiting example, gallium arsenide, silicon carbide, gallium arsenide, or a metal-containing die. The die 154 has a first side 156 and a second side 158 opposite the first side. In various implementations, the thickness of the die 154 is less than 50 micrometers (um), however, in other implementations the thickness of the die may be 50 um or more than 50 um.

In various implementations, the semiconductor package 152 may include a first metal layer 160 coupled to the first side 156 of the die 154. In such implementations, the first metal layer 160 may be, by non-limiting example, copper, aluminum, tin, silver, gold, titanium, nickel, or any other metal or metal alloy. In various implementations, the first metal layer 160 may be directly coupled to the first side 156 of the die 154, while in other implementations, as is illustrated by FIG. 16, the first metal layer may be indirectly coupled to the die 154. In various implementations, the semiconductor package 152 may include a tin layer 162 coupled to the first metal layer 160. While this disclosure primarily refers to a tin layer coupled over the first metal layer, it is understood that any other electrically and/or thermally conductive material, including any metal or metal alloy disclosed herein, may be used in place of the tin. Also, the tin used in the tin layer may be tin or a tin alloy, such as, by non-limiting example, tin/silver, tin/silver/copper, tin/antimony, and tin/lead. In various implementations, and as illustrated by FIG. 16, the tin layer 162 may be directly coupled to the first metal layer 160 with the first metal layer 160 between the tin layer and the die 154. In other implementations the tin layer 162 may be indirectly coupled to the first metal layer 160.

In various implementations, the semiconductor package 152 may include a second metal layer 164 coupled between the die 154 and the first metal layer 160. In such implementations, the semiconductor package 152 includes at least three metal layers over the die 154. The second metal layer 164 may be any type of metal or metal alloy disclosed herein. In particular implementations, the second metal layer may include tin or a tin alloy, such as, by non-limiting example, tin/silver, tin/silver/copper, tin/antimony, and tin/lead. In other particular implementations, the second metal layer 164 may include aluminum, the first metal layer 160 may include copper, and the tin layer 162 may be over and coupled to the copper layer.

In various implementations, the tin layer 162 and the first metal layer 160 may be formed into and include a plurality of bumps/studs 166. In implementations including a second metal layer 164 between the first metal layer 160 and the die 154, the second metal layer 164 may also be patterned to form a portion of the plurality of bumps 166. In particular implementations, not all three metal layers are patterned to form a plurality of bumps, but only the two outermost metal layers (in implementations having three or more metal layers over the die 154) include the plurality of bumps. In still other implementations, only the tin layer 162 may be patterned to form or include the plurality of bumps. In various implementations, and as illustrated by FIG. 16, the plurality of bumps 166 may include two bumps, however, in other implementations the plurality of bumps may include more than two bumps.

In various implementations, rather than having a plurality of metal layers forming the bumps as illustrated by FIG. 16, a single metal or metal alloy layer, including, by non-limiting example, copper, aluminum, tin, a solder, or any combination thereof, may form the plurality of bumps and may be directly coupled to the die 154. In other implementations, and as illustrated by FIG. 16, each bump of the plurality of bumps 166 may include multiple layers with a tin layer 162 coupled over the copper layer. In such implementations, the semiconductor package 152 may have the benefit of being able to bond to external connections through the tin layer 162 while also maintaining the benefit of having a copper bump or stud. In various implementations, the tin layer 162 may be much thinner than the first metal layer 160, while in other implementations, the tin layer 162 may be as thick as or thicker than the first metal layer 160. In implementations with a second metal layer 164 coupled between the first metal layer 160 and the die 154, the second metal layer may be less thick, as thick, or more thick than the first metal layer when viewed in a cross sectional view of the die 154.

In various implementations, the semiconductor package 152 may include a backside metal layer 168 coupled to the second side 158 of the die 154. The backside metal layer 168 may be any metal disclosed herein, and in various implementations, may include copper. In particular implementations, the backside metal layer may include, by non-limiting example, Ti/Ni/Cu, Ti/Cu, TiW/Cu, or any other type of metal stack or metal alloy including copper. In various implementations, and as illustrated by FIG. 16, the length of the backside metal layer 168 may be less than the length of the die 154. In such implementations, the die 154 may overhang the backside metal layer 168. In other implementations, the length of the backmetal layer 168 may be substantially the same as the length of the die 154 with the sides of the backmetal layer coextensive with the sides/perimeter of the die. In still other implementations, the back metal layer may extend beyond the sides/perimeter of the die 154. In various implementations, the back metal layer may be patterned.

Still referring to FIG. 16, in various implementations the semiconductor package 152 may include a mold compound 170. The mold compound 170 may be coupled to the die 154. In various implementations, the mold compound may include, by non-limiting example, an epoxy mold compound, an acrylic mold compound, or any other type of mold compound or protective covering capable of hardening and providing physical support and protection to a semiconductor device. In various implementations, the mold compound 170 may cover a plurality of sidewalls 172 of the first metal layer 160 and a plurality of sidewalls 174 of the tin layer. In implementations with a plurality of bumps 166, the mold compound may cover a first side 176 and a second side 178 of each bump. In various implementations, a surface 180 of the mold compound may be substantially coplanar and level with a surface 182 of the tin layer 162. In various implementations, and as is illustrated by FIG. 16, the mold compound 170 may cover the sides of the die. Specifically, the mold compound 170 may cover a third side 184 of the die 154, a fourth side 186 of the die 154, a fifth side (oriented as going into the page in FIG. 16) of the die, and a sixth side (oriented as coming off the page in FIG. 16) of the die. In the implementation illustrated by FIG. 16, the entirety of the sides of the die are covered by the mold compound 170, however, in other implementations the sides of the die 154 may only partially be covered by a mold compound 170, while in still other implementations the mold compound 170 may not cover the sides of the die 154. In various implementations, a portion of the second side 158 of the die may be covered by a mold compound. The mold compound covering the second side of the die 154 may be the same or a separate mold compound from the mold compound 170. In such implementations, the mold compound 170 may also cover the sides of the backmetal layer 168 in implementations where the backmetal layer is the same length as or shorter than the length of the die 154.

Figure 17:
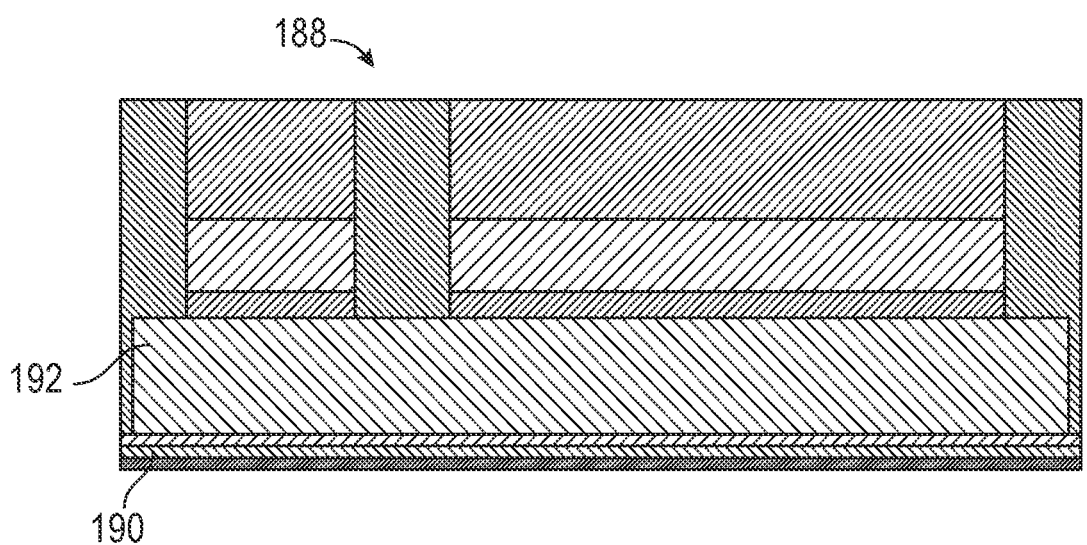
FIG. 17 is a cross-section side view of another implementation of a semiconductor package.

Referring to FIG. 17, a cross-section side view of a second implementation of a semiconductor package is illustrated. The semiconductor package of FIG. 17 may be similar to the semiconductor package of FIG. 17, with the difference being that the backside metal layer 190 may extend beyond the length of the die 192 and may be coextensive with the sides/perimeter of the semiconductor package 188. Further, as illustrated by FIG. 17, the backside metal layer 190 may include multiple layers, and in particular implementations, may include three layers. The backside metal layer may include, by non-limiting example, a metal or metal alloy including titanium, nickel, silver, vanadium, copper, and any combination thereof. In particular implementations, the backmetal layer 190 may include a layer including titanium, a layer including nickel, and a layer including a silver copper alloy. In other particular implementations, the backmetal layer may include a layer including titanium, a layer including a nickel vanadium alloy, and a layer including a silver-copper alloy.

Figure 18D:
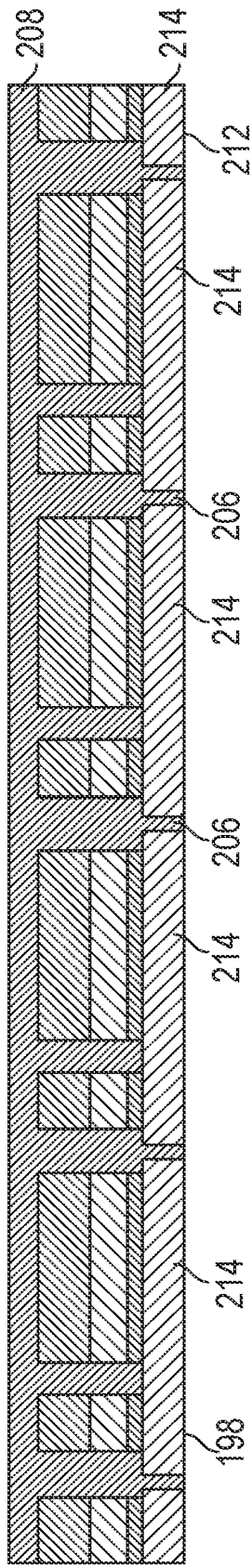

Referring to FIGS. 18A-18G, cross-section side views of a semiconductor device following various steps of an implementation of a method for forming the semiconductor package of FIG. 16 are illustrated. Referring specifically to FIGS. 18A-18B, a method for forming the semiconductor package of FIG. 16 may include forming a plurality of bumps/studs 194 on a first side 196 of a wafer 198. More specifically, the method may include forming a third metal 200 on the first side 196 of the wafer 198. The third metal layer 200 may be any metal disclosed herein, and in particular implementations, may include aluminum. The third metal layer 200 may be patterned, as illustrated by FIG. 18A, however, in other implementations the third metal layer may not necessarily be patterned.

Referring to FIG. 18B, the method may include forming a first metal layer 202 over the third metal layer 200. The first metal layer 202 may be any metal disclosed herein, and in particular implementations, includes copper. The first metal layer 202 may be patterned, as illustrated by FIG. 18B, however, in other implementations the first metal layer may not be patterned. In various implementations, the method may also include forming a second metal layer 204 over the first metal layer 202. The second metal layer 204 may be any metal disclosed herein, and in particular implementations, includes tin. The second metal layer 204 may also include a solder material. The second metal layer 204 may be patterned as illustrated by FIG. 18B, however, in other implementations where additional conductive layers cover the second metal layer 204, the second metal layer may not necessarily be patterned.

In various implementations, the method for forming the semiconductor package of FIG. 16 includes forming non-patterned metal layers over the first side 196 of the wafer 198. The method may then include etching through any number of the metal layers, including all of the metal layers coupled over the first side 196 of the wafer 198, in order to form the plurality of bumps 194. In various implementations, less than three metal layers may be coupled over the first side 196 of the wafer 198, and in particular implementations, only a single metal layer may be formed and coupled directly to the first side 196 of the wafer 198. In other implementations, more than three metal layers may be formed over the first side 196 of the wafer 198. The metal layers coupled to the first side 196 of the wafer 198 may be used to form any number of bumps over the wafer.

Referring specifically to FIG. 18B, the method for forming the semiconductor package of FIG. 16 may include forming a plurality of recesses 206 into the first side 196 of the wafer 198 to a desired depth into the wafer. In particular implementations, the depth of each recess of the plurality of recesses 206 may be less than 50 um, while in other implementations the depth may be 50 or more micrometers depending on the thickness of the wafer. In various implementations, the plurality of recesses 206 may be formed using a saw, a laser, a plasma etch, a chemical etch, or any other method for forming a recess in a wafer. In implementations where an etch is used, the etch may be an etching process marketed under the tradename BOSCH® (the "Bosch process") by Robert Bosch GmbH, Stuttgart, Germany, may be used to form the plurality of recesses 206 in the wafer 198. In such implementations, the sidewalls of the plurality of recesses 206 may be slightly patterned or ridged which may facilitate adhesion of a mold compound to the sidewalls of the plurality of recesses 206. In various implementations, the plurality of recesses 206 may be positioned in the wafer 198 so that they are between the semiconductor devices in the wafer.

Referring to FIG. 18C, the method for forming the semiconductor package of FIG. 16 includes applying a mold compound 208 to the first side 196 of the wafer 208. The mold compound may include any type of mold compound disclosed herein and may be applied using, by non-limiting example, a liquid dispensing technique, a transfer molding technique, a vacuum molding technique, a glob top molding technique, or a compression molding technique. In various implementations, and as illustrated by FIG. 18C, the mold compound 208 may encapsulate the plurality of bumps 194 and fill the plurality of recesses 206. In other implementations, the mold compound 208 may only be applied within the plurality of recesses 206 and between the plurality of bumps 194 without flowing over the outer surfaces 210 of the plurality of bumps 194.

Referring to FIG. 18D, the method for forming the semiconductor package of FIG. 16 may include thinning a second side 212 of the wafer 198 to the desired depth of the plurality of recesses 206. In particular implementations, the method may include backgrinding a second side 212 of the wafer 198 to reach the plurality of recesses 206 and singulate a plurality of die 214 from the wafer. In implementations where the second side 212 of the wafer 198 is background, the backgrinding may use a process marketed under the trade name TAIKO by DISCO of Tokyo, Japan. The backgrinding leaves a ring of non-removed material (TAIKO ring) along the perimeter of the wafer which helps to prevent the wafer from curling, warping or otherwise bending during processing while at the same time removing most of the thickness and material of the second side 212, or backside of the wafer 198. The ring is then subsequently removed in a separate cutting step prior to singulation of the die. In other implementations of methods of forming semiconductor devices the TAIKO process may not be used, but some other backgrinding or other material-removal technique may be used, such as removing the material through a wet etch. In various implementations, the thinned wafer 198, or plurality of die 214, may be less than 50 um thick, while in other implementations the thinned wafer, or plurality of die, may be 50 or more um thick. The mold compound 208 coupled to the first side 196 of the wafer 198 and within the plurality of recesses 206 may facilitate thinning the wafer 198 by providing structural support to the wafer. In other implementations, the second side 212 of the wafer may not be thinned to the depth of the desired recesses 206. In this manner, the die of each semiconductor package may be stepped upon singulating the wafer 198.

Figure 18E:
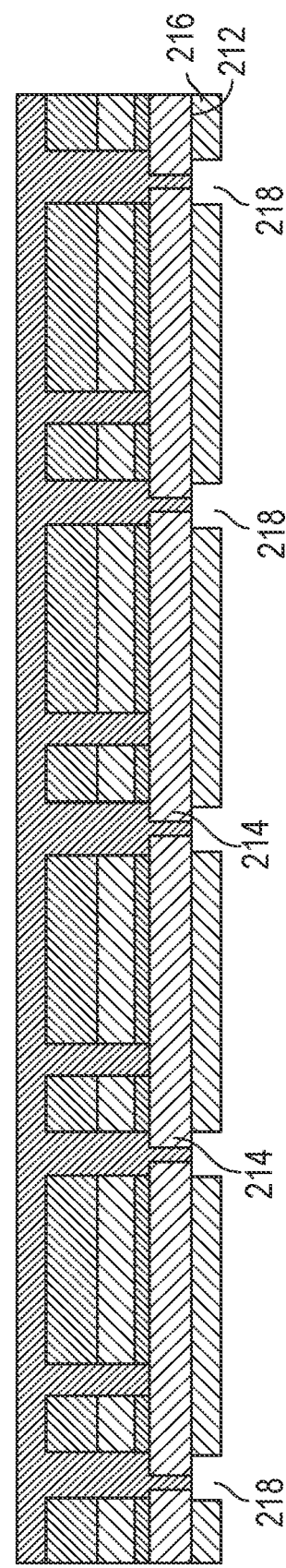

Referring to FIG. 18E, the method for forming the semiconductor package of FIG. 16 may include coupling a backside metal layer 216 to the second side 212 of the wafer 198 or to the second side of the plurality of die 214. The backside metal layer 216 may be any type of metal disclosed herein, and in particular implementations, may include copper. In various implementations, the backside metal layer may be coupled to the second side of the wafer through an electroplating process. In other implementations, the backside metal layer may be coupled to the second side of the wafer through a sputtering process or an electroplating process. In still other implementations, the backside metal layer may be a metal frame/film coupled to the wafer through, by non-limiting example, sintering, soldering, or fusion bonding. In various implementations, the backside metal layer 216 may be a thick backside metal layer and in particular implementations, may be as thick as or thicker than the thinned wafer 198. In various implementations, the method for forming the semiconductor package of FIG. 16 may include forming a plurality of openings 218 in the backside metal layer 216. In other implementations, the backside metal layer 216 may not include any openings therein. In implementations where a plurality of openings 218 are formed in the backside metal layer 216, the method may include, though not illustrated, applying a second mold compound to the second side 212 of the wafer 198 that fills the plurality of openings 218. The second mold compound may be the same as or different from the first mold compound 208. In various implementations, the second mold compound may also encapsulate the backside metal layer 216. In such implementations, the method may include backgrinding the second mold compound to expose the backside metal layer. In implementations with the second mold compound applied to the second side 212 of the wafer 198, the entirety of the die of the singulated semiconductor may be at least partially covered by a mold compound on all six sides of the die. In implementations where the second side 212 of the wafer 198 is background using the Taiko process, the Taiko ring may be removed after the backside metal is coupled to/formed on the second side of the wafer using a separate singulation process.

Figure 18F:
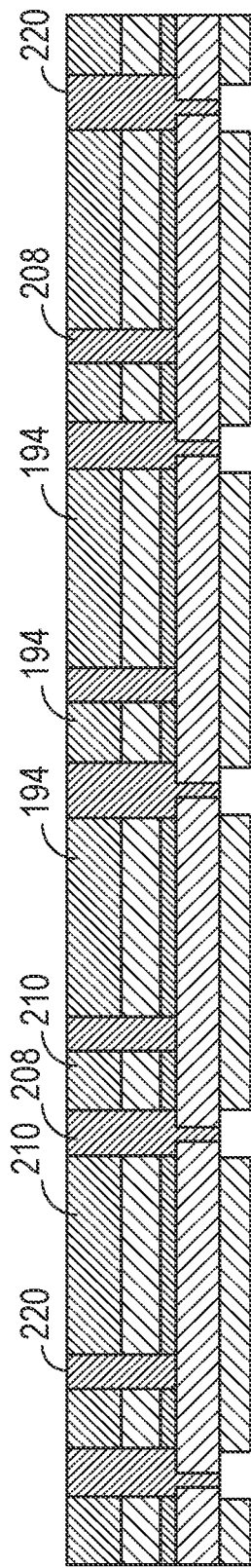

Referring to FIG. 18F, the method for forming the semiconductor package of FIG. 16 may include exposing the outer surface 210 of the plurality of bumps 194 through the mold compound 208 by grinding the mold compound 208. In various implementations, only the mold compound may be ground until it is coextensive with the surface 210, however, in other implementations the mold compound and a portion of the plurality of bumps 194 may be ground together. In this manner, the method may include planarizing the outer surface 210 of the plurality of bumps 194 with the outer surface 220 of the mold compound 208. The backmetal layer 216 may facilitate the thinning of the mold compound 208 by adding structural support to the wafer 198 and the plurality of die 214. In various implementations, and as illustrated by the order of FIGS. 18C-18F, the second side 212 of the wafer 198 may be thinned before the mold compound 208 is ground to expose the plurality of bumps 194, however, in other implementations the method may include grinding the mold compound 208 to expose the plurality of bumps before the second side 212 of the wafer 198 is thinned.

Figure 18G:
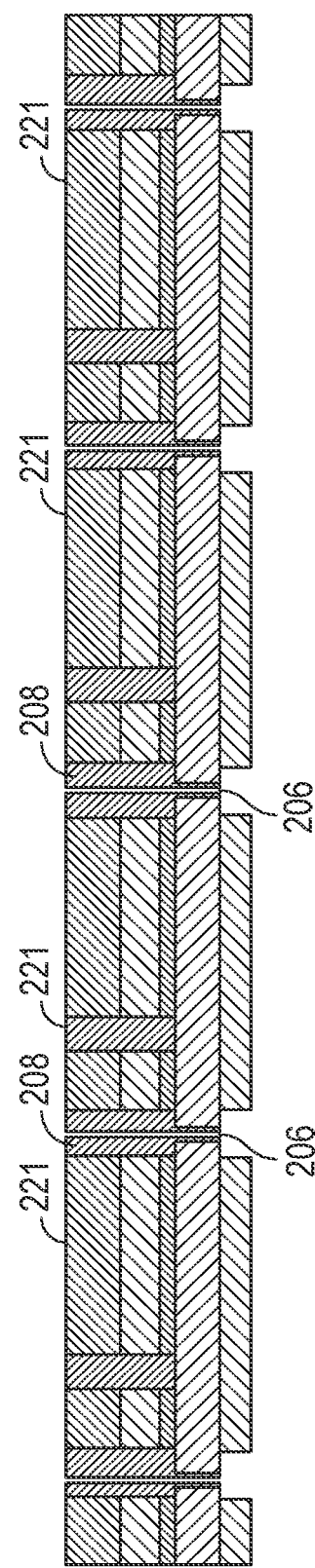

Referring to FIG. 18G, the method for forming the semiconductor package of FIG. 16 includes singulating the mold compound 208 through the plurality of recesses 206 into a plurality of semiconductor packages 221. The mold compound may be singulated using a saw, a laser, a plasma etch, water jet cutting, a chemical etch, or any other method for cutting or removing mold compound. In various implementations, the singulation line (or the width of the cut/etch made to singulate the mold compound) may be less wide as compared to the width of each recess of the plurality of recesses 206. In such implementations, the sidewalls of each die of the plurality of semiconductor packages may be covered by the mold compound 208. In implementations where the backside metal is not patterned, the backside metal may be singulated along with the mold compound to form the plurality of semiconductor packages.

Figure 19A:
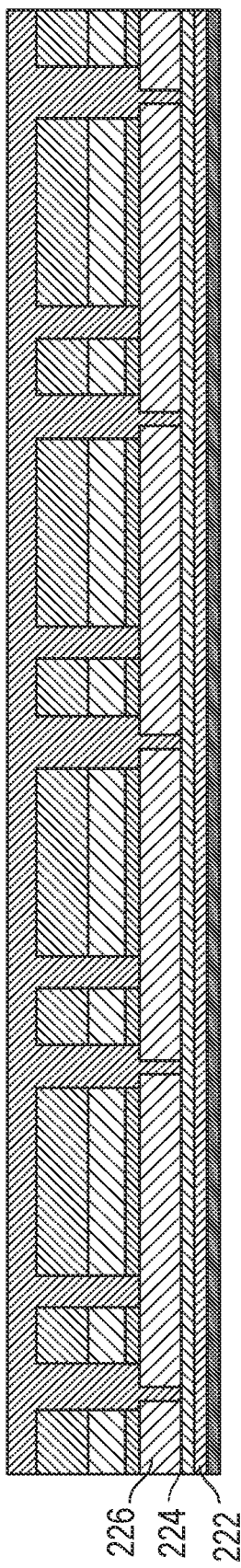
FIGS. 19A-19C are cross-section side views of a semiconductor device following various steps of a method for forming the semiconductor package of FIG. 17.
Figure 19B:
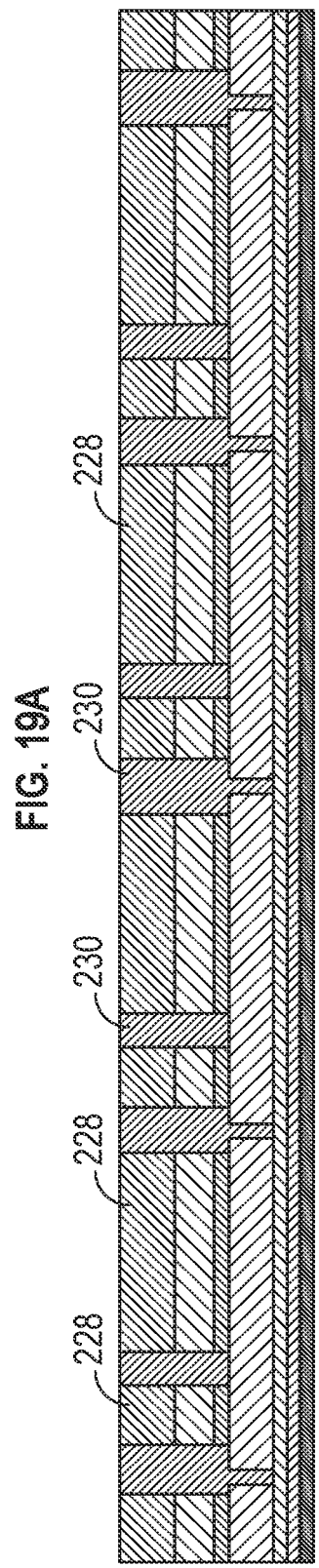
Figure 19C:
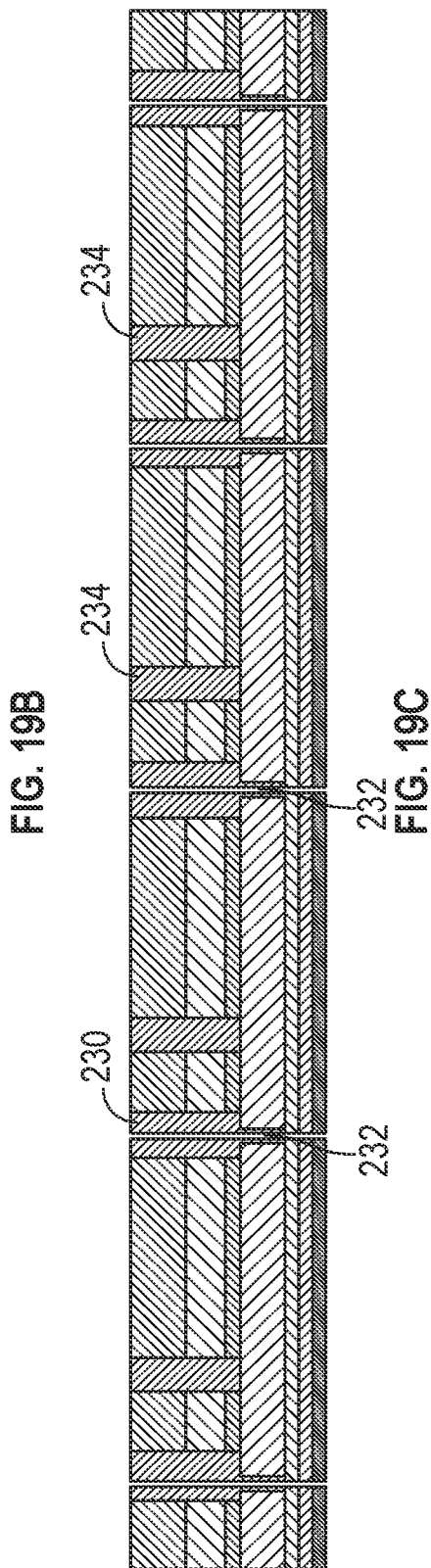

Referring to FIGS. 19A-19C, cross-section side views of a semiconductor device after steps of an implementation of a method for forming the semiconductor package of FIG. 17 are illustrated. Referring specifically to FIG. 19A, the method for forming the semiconductor package of FIG. 17 may be similar to the method illustrated in FIGS. 18A-18G, with the difference being that the method may include coupling a backside metal layer 222 to the second side 224 of the wafer 226 (or coupling a backside metal layer to a second side of the plurality of die), with the backside metal layer including multiple backside metal layers. In the implementation illustrated by FIG. 19A the method includes coupling a backside metal layer 222 which includes three different backside metal layers. In various implementations, the backside metal layer 222 may include more than or less than three backside metal layers.

Each layer of the backside metal layer may be deposited to the wafer through, by non-limiting example, a sputtering or evaporation technique. In various implementations, the backside metal layer may include, by non-limiting example, titanium, nickel, silver, copper, vanadium, or any other metal. In particular implementations, the backside metal layer may include a titanium layer, a nickel layer, and a silver-copper layer. In other particular implementations, the backside metal layer may include a titanium layer, a nickel-vanadium layer, and a silver-copper layer. In various implementations, and as illustrated by FIG. 19A, the backside metal layer 222 may be patterned or may not be patterned.

Referring to FIG. 19B, the method for forming the semiconductor package of FIG. 17 may include exposing the plurality of bumps 228 through the mold compound 230 by grinding the mold compound. The plurality of bumps may be exposed using the same method or a similar method as described above in relation to FIG. 18F.

Referring to FIGS. 19A and 19C, the method for forming the semiconductor package of FIG. 17 includes singulating the mold compound 230 through the plurality of recesses 232 and the backside metal layer 222 into a plurality of semiconductor packages 234. The mold compound 230 and the backside metal layer 222 may be singulated using any method disclosed herein. As the backside metal layer is not patterned, the sidewalls of the backside metal layer may be coextensive with the sides of the respective semiconductor packages 234.

The methods for forming semiconductor packages disclosed herein may allow for the formation of thin die without needing a dual metallization process for the purpose of stress balance. The mold compound and the backside metal layer may offer the necessary support needed to handle the thinned die and wafer during formation of the semiconductor packages.

Figure 20:
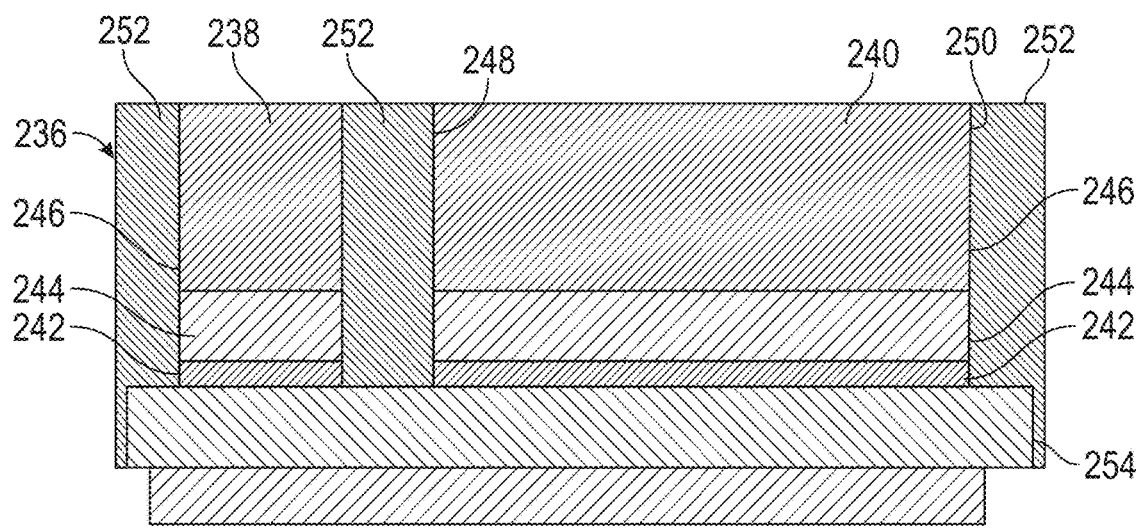
FIG. 20 is a cross-section side view of an implementation of a semiconductor package with lengthened electrical contacts.

Referring to FIG. 20, an implementation of a semiconductor package 236 is illustrated that is similar to package implementations already disclosed in this document. However, in this implementation, the package 236 includes electrical contacts 238, 240 that include a pad layer 242, a plated metal layer 244, and a solder resist layer 246. The electrical contacts 238, 240 extend through openings 248, 250 in an organic material 252. In the implementation illustrated, the organic material 252 is a mold compound, which may be any mold compound disclosed in this document. In this implementation, the height of the electrical contacts 238, 240 is higher/longer than in the other electrical contact implementations disclosed in this document. In this implementation, the layer that increases the height of the electrical contacts 238, 240 is the solder resist layer 246. However, in other implementations, the thickness/height of the plated metal layer 244 may be increased through increased plating of metal to increase the height of the electrical contacts 238, 240.

The effect of increasing the height of the electrical contacts through changing the predetermined height of the formed portion of the electrical contacts 238, 240 is that the resulting semiconductor package has increased structural support, particularly where the semiconductor die 254 is thinned. Any of the thinned semiconductor die disclosed herein may be utilized in various package implementations. In particular implementations, the thickness of the thinned semiconductor die 254 may be between about 0.1 microns to about 125 microns. As the length of the electrical contacts 238, 240 lengthens, the combination of the material of the electrical contacts and the organic material 252 provides additional structural support to the die, which in various implementations may reduce a warpage of the thinned semiconductor die 254. In particular implementations, the warpage may be less than 25 microns; in others, the warpage may be less than 50 microns; in still others, the warpage may be less than 75 microns, and in yet other implementations, the warpage may be less than 200 microns. The length of the electrical contacts 238, 240 is determined in various implementations to determine the desired warpage of the particular thinned die being used.

In various implementations, the warpage may be measured using various techniques. For example, a capacitative scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, New York. In other implementations, the warpage may be measured by a laser profilometer utilizing confocal sensors marketed under the tradename ACUITY by Schmitt Industries, Inc. of Portland, Oregon. In other implementations, any of the following shape/profile measurement systems marketed by Keyence Corporation of America of Itasca, Illinois could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

In various implementations, solder resist may not be used and the entire material of the electrical contact besides the pad may be made of plated metal. In other implementations, however, the metal layer(s) besides the pad material may be formed using, by non-limiting example, electroplating, electroless plating, evaporating, sputtering, soldering, screen printing, silver sintering, sintering, any combination thereof, or any other method of forming a metal-containing material into an electrical contact.

The various methods of forming electrical contacts disclosed in this document may be employed to form electrical contacts with lengthened formed portions through choosing those process parameters for the particular metal-containing material process that will allow deposition/forming of the metal-containing material to the desired height to create the desired structural support and/or warpage of the semiconductor die/semiconductor package. In particular implementations, a method of forming a semiconductor package includes providing a semiconductor substrate like any disclosed herein that includes a plurality of semiconductor die like any disclosed herein where the semiconductor substrate includes a first side and a second side. The method includes forming a plurality of electrical contacts on the first side of the semiconductor die through forming at least a portion of the plurality of electrical contacts to a predetermined height where the plurality of electrical contacts are coupled with the plurality of semiconductor die. The method also includes applying an organic material like any disclosed herein to the first side of the semiconductor die where the one or more electrical contacts extend into one of more openings in the organic compound. In various implementations, because the organic compound is applied over the electrical contacts, the electrical contacts themselves form the openings in the organic compound. The method also includes leveling the organic material with a surface of the plurality of electrical contacts. In various implementations, as disclosed herein, the process of leveling includes grinding/polishing the organic material down to the level of the top of the plurality of electrical contacts. In other implementations, the process of leveling may occur in a curing/reflowing process where the organic material flows around the plurality of electrical contacts until it reaches the level of the upper surfaces of the electrical contacts at their predetermined height. Following leveling of the organic material, the plurality of semiconductor packages may then be singulated one from the other using any singulation method disclosed herein. In various method implementations, additional grooving, thinning, backmetal forming and other steps like those disclosed herein may be utilized and selected using the principles disclosed herein.

Figure 21:
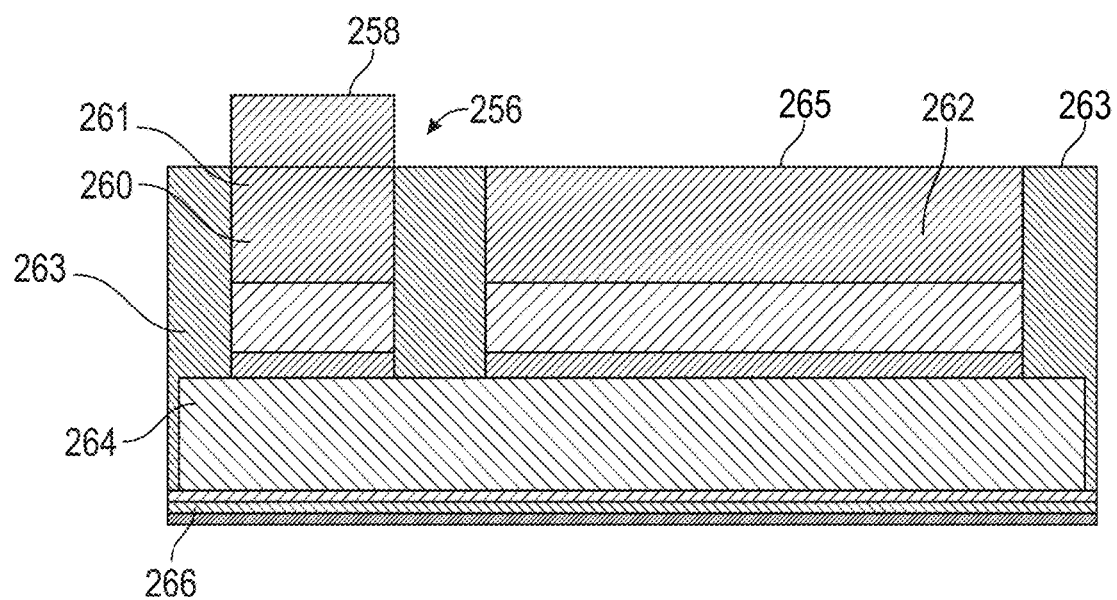
FIG. 21 is a cross-section side view of an implementation of a semiconductor package with a slug coupled to an electrical contact.

Referring to FIG. 21, an implementation of a semiconductor package 256 with a slug 258 coupled thereto is illustrated. In this implementation, the slug 258 is coupled to one of the electrical contacts 260 in the opening 261 of the organic material 263 of the package 256. In other implementations, however, slugs may be coupled to both electrical contacts 260, 262 of the package 256. The slug 258 may generally be used to support wirebonding to the electrical contact 260 and not in flip chip bonding packaging operations. The material of the slug 258 may also permit the thickness of the semiconductor die 264 to be made very thin—toward the lower ends of the thickness ranges disclosed herein while permitting wirebonding to be successfully carried out. In various implementations, the slug 258 may also assist the package with handling electrical surge and other electrical capacity needs during operation. A slug 258 may be utilized in packages where backmetal 266 is applied in one or more layers to the thinned semiconductor die 264, or in packages where no backmetal is utilized. Any of the metal layers, such as a metal-containing layer 265, metal types, and methods of forming the metal layer(s) of the electrical contacts disclosed in this document may be employed in various implementations. In various implementations, the slug 258 may include copper.

Figure 22:
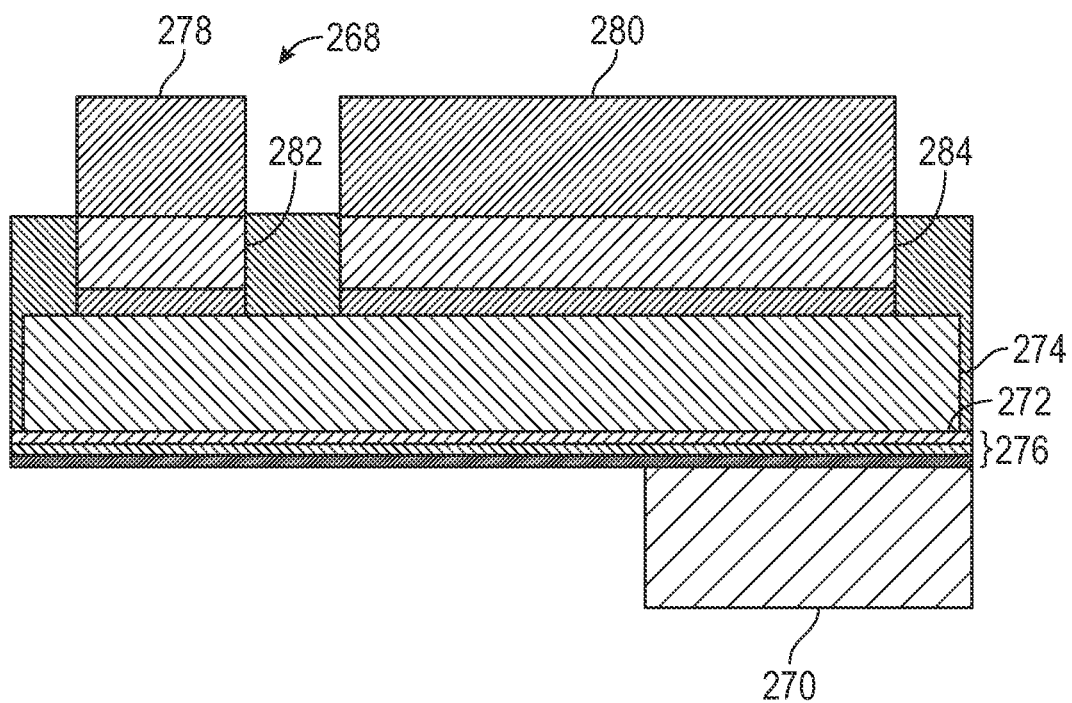
FIG. 22 is a cross-section side view of an implementation of a semiconductor package with a slug coupled to back-metal.

Referring to FIG. 22, another implementation of a semiconductor package 268 is illustrated. In this implementation, a slug 270 is coupled to a second side 272 of the thinned semiconductor die 274. In this case, the slug 270 is attached to backmetal layers 276 formed on the second side of die 274. In this package implementation, bumps/stud bumps/pillars 278, 280 are coupled to electrical contacts 282, 284, respectively. This particular package implementation 268 is designed to be bonded using a flip chip process and then wirebonded to slug 270 on the back side/second side 272 of the package.

In the implementations of semiconductor packages 256, 268 of FIGS. 21 and 22, semiconductor die of any of the thicknesses disclosed herein may be utilized, along with any of the organic materials disclosed herein, and any of the metal-containing layers and metals disclosed herein.

Figure 23A:
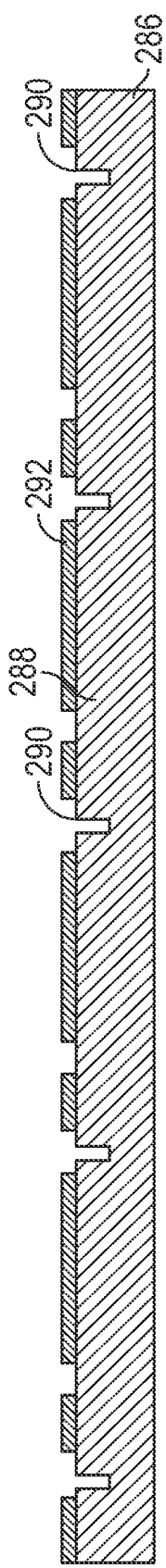
FIGS. 23A-G are cross-section side views illustrating a semiconductor package following various steps of a method for forming the semiconductor package of FIG. 21.
Figure 23B:
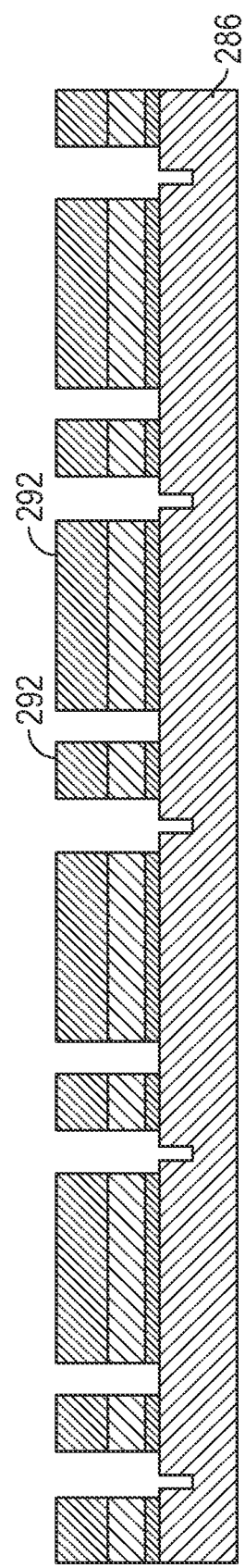

In various method implementations, no precut or partial grooving between the plurality of die of a semiconductor substrate may be carried out prior to the application of an organic compound. Where the plurality of die will be thinned, the depth of the die/saw streets/scribe lines themselves may be sufficient to carry out the various methods of forming semiconductor packages disclosed herein. For example where a semiconductor substrate will be thinned to about 10 microns, the about 5 micron depth of the die streets into the material of the substrate/die resulting from the processing steps that form the separate semiconductor die suffices to act as the equivalent of any partial grooving/precutting. FIG. 23A illustrates a semiconductor substrate 286 with a plurality of semiconductor die 288 with die streets 290 between the plurality of semiconductor die 288. Die pads 292 are formed as part of semiconductor die 288. FIG. 23B illustrates the substrate 286 following formation of electrical contacts 292 using any of the methods of forming electrical contacts disclosed herein.

Figure 23C:
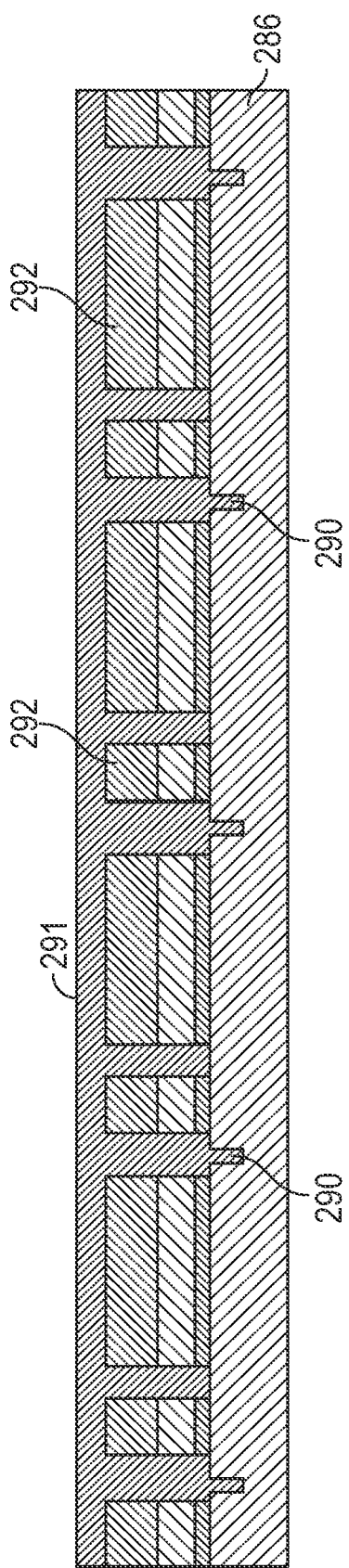
Figure 23D:
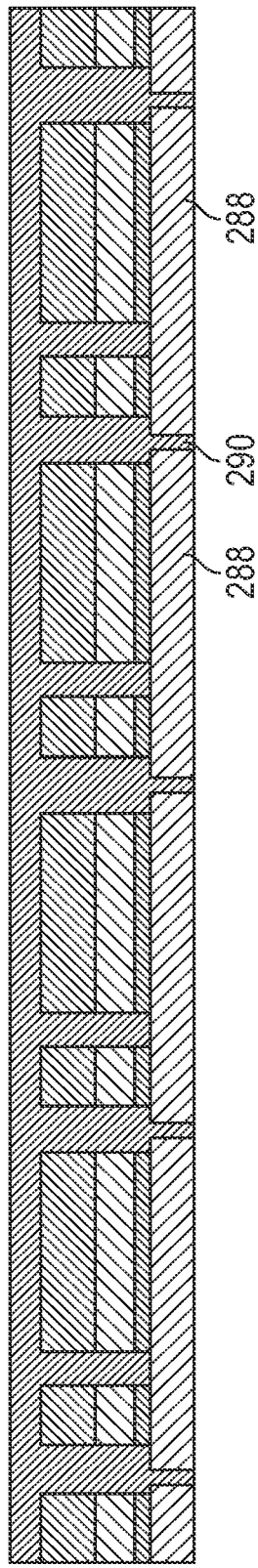
Figure 23E:
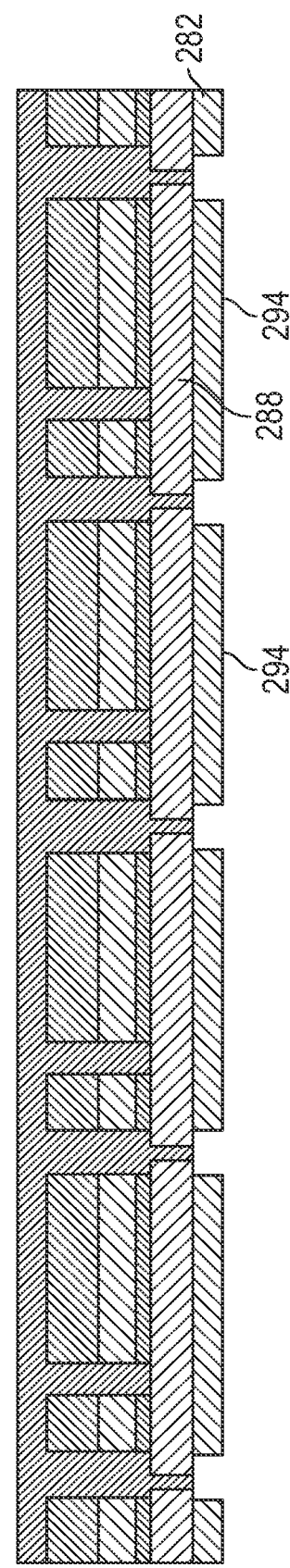
Figure 23F:
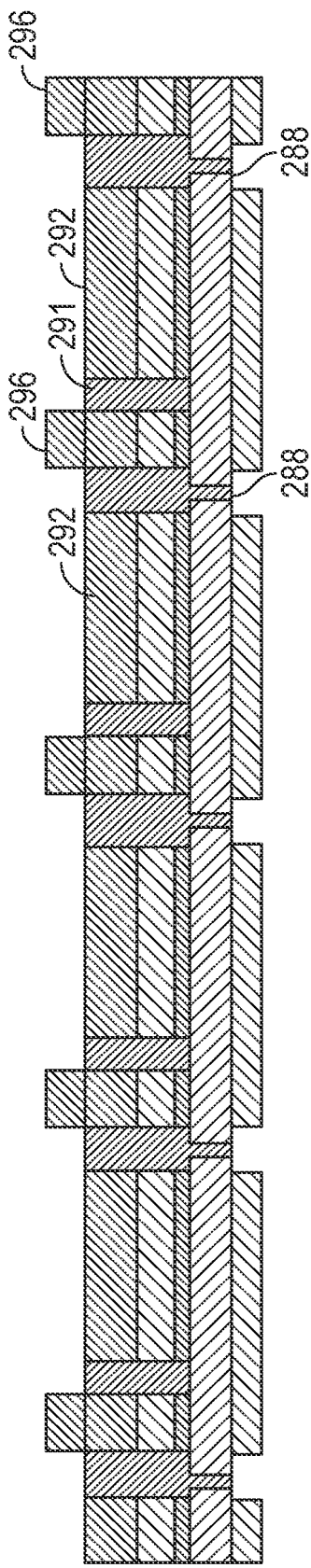
Figure 23G:
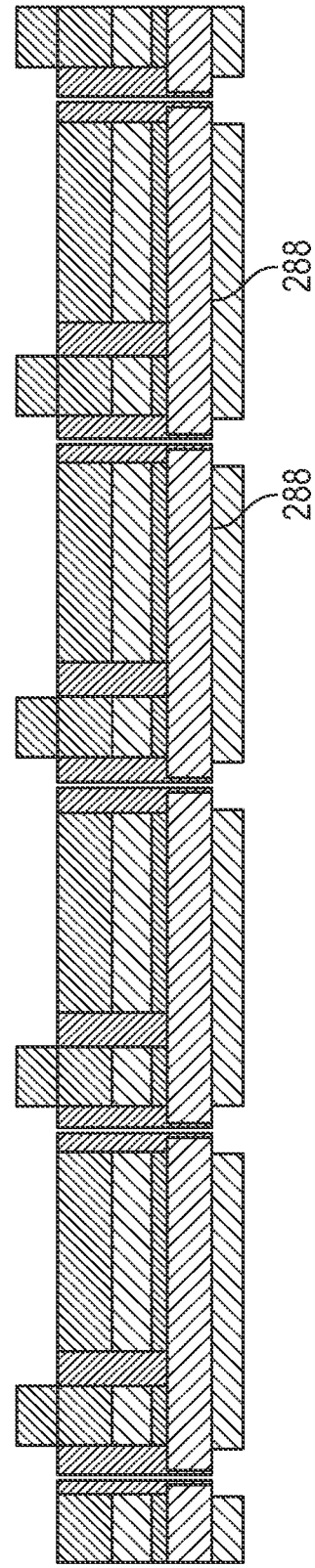

FIG. 23C illustrates the semiconductor substrate 286 implementation following application of organic material 291 over the electrical contacts 292 which fills the die streets 290. FIG. 23D illustrates semiconductor substrate 286 following a thinning process that singulates the plurality of semiconductor die 288 at the die streets 290. The thinning process may be carried out using any methods and process of thinning disclosed in this document. FIG. 23E illustrates the plurality of semiconductor die 288 following application of backmetal 294 which has been patterned to correspond with each of the plurality of semiconductor die 288. Any of the methods and processes for forming backmetal disclosed herein may be employed in various method implementations. In other implementations, however, the backmetal may not be formed. Referring to FIG. 23F, the plurality of die 288 are illustrated following leveling of the organic material 291 with the surface of the electrical contacts 292. As illustrated, slugs 296 have also been coupled to the electrical contacts 292. In various implementations, the slugs 296 may be formed through a photoresist, screen printing, or stencil printing pattering and electroplating/electroless plating process. In other implementations, the slugs 296 may be adhered to the electrical contacts 292 using a bonding material. In other implementations, the slugs 296 may be coupled to the electrical contacts 292 through a sintering process, such as, by non-limiting example, a silver sintering process or other sintering technique in various implementations. The slugs may include any of a wide variety of metal containing materials, including, by non-limiting example, metal foil, metal film, copper, copper alloys, or any other metal-containing material. FIG. 23G illustrates the plurality of die 288 following a singulation process through the organic material 291 that leaves the sidewalls of the die covered at least partially by the organic material like those package implementations disclosed herein. Any of the singulation methods and systems disclosed herein may be employed in various method implementations.

Figure 24A:
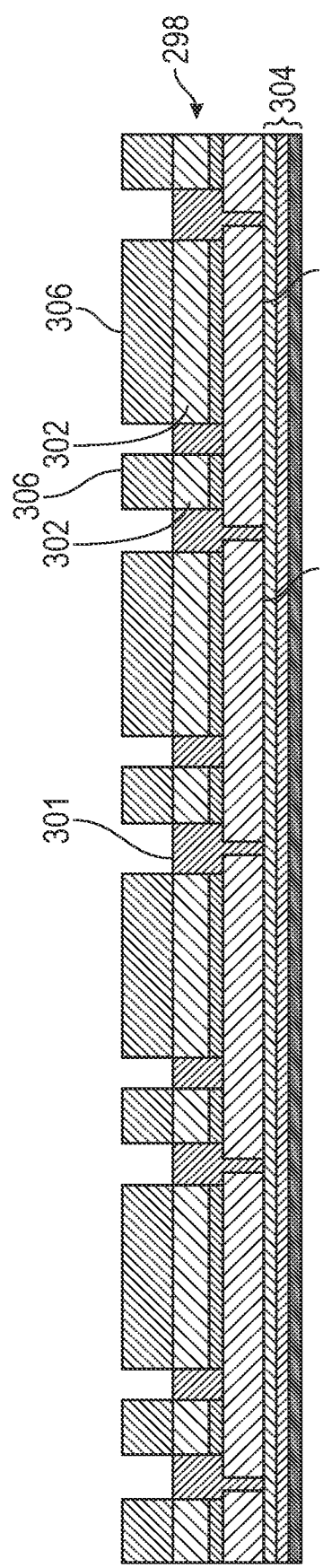
FIGS. 24A-C are cross-section side views illustrating a semiconductor package following various steps of a method for forming the semiconductor package of FIG. 22.
Figure 24B:
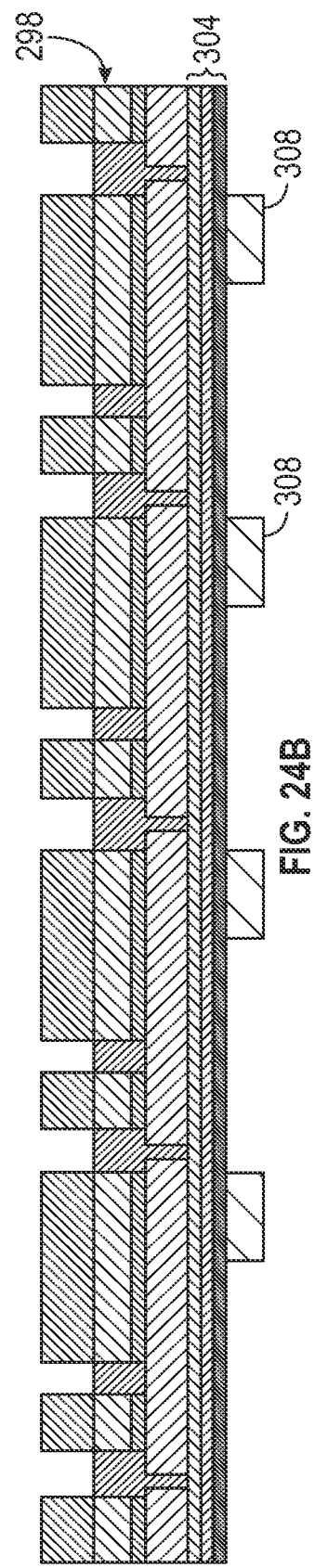
Figure 24C:
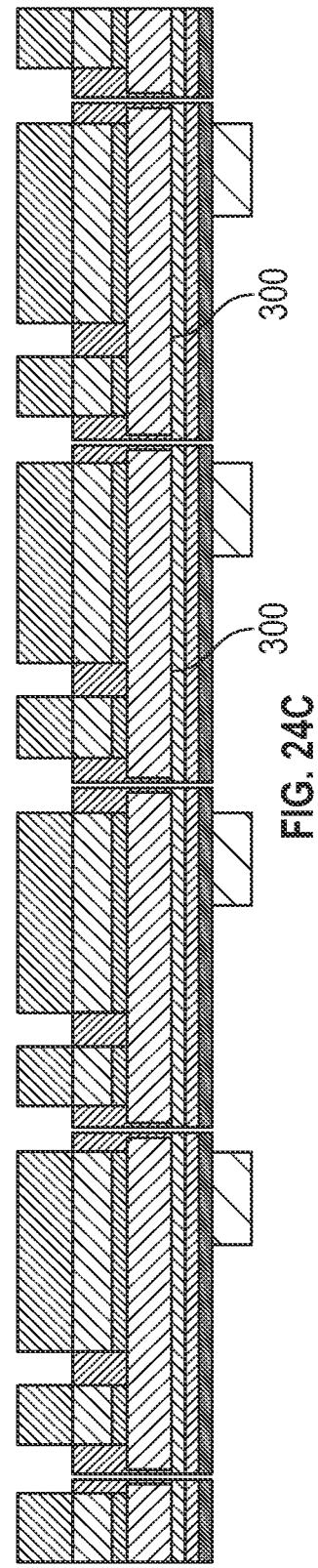

Referring to FIGS. 24A-C, another semiconductor substrate 298 is illustrated as various steps in an implementation of a method of forming semiconductor packages. FIG. 24A illustrates the substrate 298 following thinning and singulation of the plurality of die 300, formation of electrical contacts 302, leveling of organic material 301, and application of backmetal layers 304. Bumps/stud bumps/pillars 306 have also been coupled to the electrical contacts 302 through, by non-limiting example, pattering and plating, ball drop, ball bonding, or any other method of forming/attaching a ball/pillar/stud to an electrical contact. FIG. 24B illustrates the substrate 298 of FIG. 24A after coupling of slugs 308 to the backmetal layers 304. FIG. 24C illustrates the plurality of die 300 following singulation of the semiconductor packages using any singulation technique disclosed herein. A wide variety of method implementations involving the formation and attachment of slugs to electrical contacts may be employed using the principles disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:
1. A semiconductor package, comprising:
a semiconductor die comprising a first side and a second side, the first side of the semiconductor die coupled to one or more electrical contacts;
an organic material covering at least the first side of the semiconductor die, wherein the one or more electrical contacts extend through one or more openings in the organic material;
a metal-containing layer comprised in the one or more electrical contacts; and
one or more slugs directly coupled to an outer surface of the metal-containing layer;
wherein the outer surface of the metal-containing layer is coplanar with an outermost surface of the organic material.

2. The package of claim 1, wherein the metal-containing layer is a solder resist layer.

3. The package of claim 1, wherein the package comprises a single slug.

4. The package of claim 1, wherein the slug is configured to support wirebonding.

5. The package of claim 1, wherein the organic material is directly coupled to five sides of the semiconductor die.

* * * * *